United States Patent
Honda et al.

(10) Patent No.: US 12,366,538 B2
(45) Date of Patent: Jul. 22, 2025

(54) DEFECT INSPECTION APPARATUS AND DEFECT INSPECTION METHOD

(71) Applicant: HITACHI HIGH-TECH CORPORATION, Tokyo (JP)

(72) Inventors: Toshifumi Honda, Tokyo (JP); Yuta Urano, Tokyo (JP); Eiji Arima, Tokyo (JP); Hiromichi Yamakawa, Tokyo (JP); Shunichi Matsumoto, Tokyo (JP); Hisaaki Kanai, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 272 days.

(21) Appl. No.: 17/913,553

(22) PCT Filed: Apr. 2, 2020

(86) PCT No.: PCT/JP2020/015161
§ 371 (c)(1),
(2) Date: Sep. 22, 2022

(87) PCT Pub. No.: WO2021/199397
PCT Pub. Date: Oct. 7, 2021

(65) Prior Publication Data
US 2023/0175978 A1    Jun. 8, 2023

(51) Int. Cl.
*G01N 21/95* (2006.01)
*G01N 21/47* (2006.01)
(Continued)

(52) U.S. Cl.
CPC .......... *G01N 21/9501* (2013.01); *G01N 21/47* (2013.01); *G01N 21/88* (2013.01);
(Continued)

(58) Field of Classification Search
CPC ............... G01N 21/9501; G01N 21/47; G01N 21/8806; G01N 21/8851; G01N 21/93;
(Continued)

(56) References Cited

U.S. PATENT DOCUMENTS 7,525,649 B1    4/2009    Leong et al.
8,922,764 B2    12/2014   Urano et al.
(Continued)

FOREIGN PATENT DOCUMENTS

JP    H08-201306 A    8/1996
JP    H10-123429 A    5/1998
(Continued)

OTHER PUBLICATIONS

Search Report mailed Aug. 4, 2020 in International Application No. PCT/JP2020/015161.
(Continued)

*Primary Examiner* — Michelle M Iacoletti
*Assistant Examiner* — Judy Dao Tran
(74) *Attorney, Agent, or Firm* — Miles & Stockbridge, P.C.

(57) ABSTRACT

A defect inspection apparatus includes an illumination unit configured to irradiate a surface of a sample with a linear illumination spot; a condensing detection unit configured to condense reflected light of the illumination spot and to control a polarization state of the incident light to form an optical image; and a sensor unit configured to output the optical image and including an array-shaped light receiving portion and an antireflection film at a position conjugate with the illumination spot, in which the condensing detection unit includes a polarization control unit configured to increase light incident efficiency to the sensor unit. The normal line of the light receiving surface of the sensor unit is inclined from the optical axis of the condensing detection
(Continued)

unit by 10 degrees or more and less than 80 degrees. The light condensing detection unit increases the optical magnification in the lateral direction of the illumination spot.

11 Claims, 23 Drawing Sheets

(51) Int. Cl.
 *G01N 21/88* (2006.01)
 *H01L 21/67* (2006.01)
(52) U.S. Cl.
 CPC ... *G01N 2201/10* (2013.01); *G01N 2223/646* (2013.01); *H01L 21/67288* (2013.01)
(58) Field of Classification Search
 CPC .......... G01N 21/956; G01N 21/95607; G01N 21/95; G01N 21/95623; G01N 2201/10; G01N 2201/06113; G01N 2201/0636; G01N 2201/068; G01N 2201/0697; G01N 2201/12; G01N 2021/8848; G01N 2021/8822; G01N 2021/4707; G01N 2021/4711; G01N 2021/8864; G01N 21/88; G01N 2223/646; G01N 21/94; G01N 2201/1042; G01N 2201/1045; G01J 1/0474; H01L 21/67288
 USPC .............................. 356/237.1–237.5, 364–369
 See application file for complete search history.

(56) References Cited

U.S. PATENT DOCUMENTS

| | | | | |
|---|---|---|---|---|
| 9,568,439 | B2* | 2/2017 | Honda | ................... G01J 1/0474 |
| 2005/0052644 | A1 | 3/2005 | Lewis et al. | |
| 2005/0105791 | A1 | 5/2005 | Lee et al. | |
| 2006/0290923 | A1 | 12/2006 | Nakano et al. | |
| 2009/0059216 | A1 | 3/2009 | Shibata et al. | |
| 2009/0185179 | A1 | 7/2009 | Hill | |
| 2009/0279081 | A1 | 11/2009 | Urano et al. | |
| 2013/0114078 | A1* | 5/2013 | Honda | ............... G01N 21/8806 356/237.1 |
| 2013/0176552 | A1 | 7/2013 | Brown et al. | |
| 2013/0301042 | A1 | 11/2013 | Urano et al. | |
| 2013/0301904 | A1* | 11/2013 | Lee | ................... G01N 21/8806 382/145 |
| 2014/0253719 | A1* | 9/2014 | Rueb | ................. G01N 21/8806 348/92 |
| 2014/0268122 | A1 | 9/2014 | Matsumoto et al. | |
| 2014/0368618 | A1 | 12/2014 | Ushinaga et al. | |
| 2015/0071316 | A1 | 3/2015 | Chuang | |
| 2015/0146200 | A1 | 5/2015 | Honda et al. | |
| 2016/0139059 | A1* | 5/2016 | Matsumoto | .......... G01N 21/956 356/51 |
| 2017/0146463 | A1 | 5/2017 | Honda et al. | |
| 2020/0256804 | A1 | 8/2020 | Honda et al. | |
| 2022/0291140 | A1* | 9/2022 | Honda | ............... G01N 21/9501 |
| 2022/0357285 | A1 | 11/2022 | Honda et al. | |
| 2024/0230551 | A9* | 7/2024 | Urano | ................... G01N 21/93 |

FOREIGN PATENT DOCUMENTS

| | | | |
|---|---|---|---|
| JP | 2007-033433 | A | 2/2007 |
| JP | 2009-053132 | A | 3/2009 |
| JP | 2009-236791 | A | 10/2009 |
| JP | 2012-021994 | A | 2/2012 |
| JP | 2012-137350 | A | 7/2012 |
| JP | 2014-534611 | A | 12/2014 |
| JP | 2015-028457 | A | 2/2015 |
| JP | 2015-197320 | A | 11/2015 |
| JP | 2016-027342 | A | 2/2016 |
| JP | 2019-133176 | A | 8/2019 |
| WO | 2007110672 | A1 | 10/2007 |
| WO | 2013094121 | A1 | 6/2013 |
| WO | 2013161912 | A1 | 10/2013 |
| WO | 2018216277 | A1 | 11/2018 |
| WO | 2019064991 | A1 | 4/2019 |
| WO | 2020136697 | A1 | 7/2020 |
| WO | 2021029025 | A1 | 2/2021 |

OTHER PUBLICATIONS

Written Opinion mailed Aug. 4, 2020 in International Application No. PCT/JP2020/015161.
Office Action mailed Apr. 5, 2024 in U.S. Appl. No. 17/630,264.
Notice of Allowance mailed Sep. 29, 2024 in U.S. Appl. No. 17/630,264.
International Preliminary Report on Patentability mailed Nov. 11, 2021 in International Application No. PCT/JP2021/003285.
Search Report mailed Apr. 27, 2021 in International Application No. PCT/JP2021/003285.
Written Opinion mailed Apr. 27, 2021 in International Application No. PCT/JP2021/003285.
International Preliminary Report Patentability mailed Aug. 3, 2023 in International Application No. PCT/JP2021/003285.
Search Report mailed Nov. 5, 2019 in International Application No. PCT/JP2019/030561.
Written Opinion mailed Nov. 5, 2019 in International Application No. PCT/JP2019/030561.
International Preliminary Report in Patentability mailed Jun. 7, 2021 in International Application No. PCT/JP2019/030561.

* cited by examiner

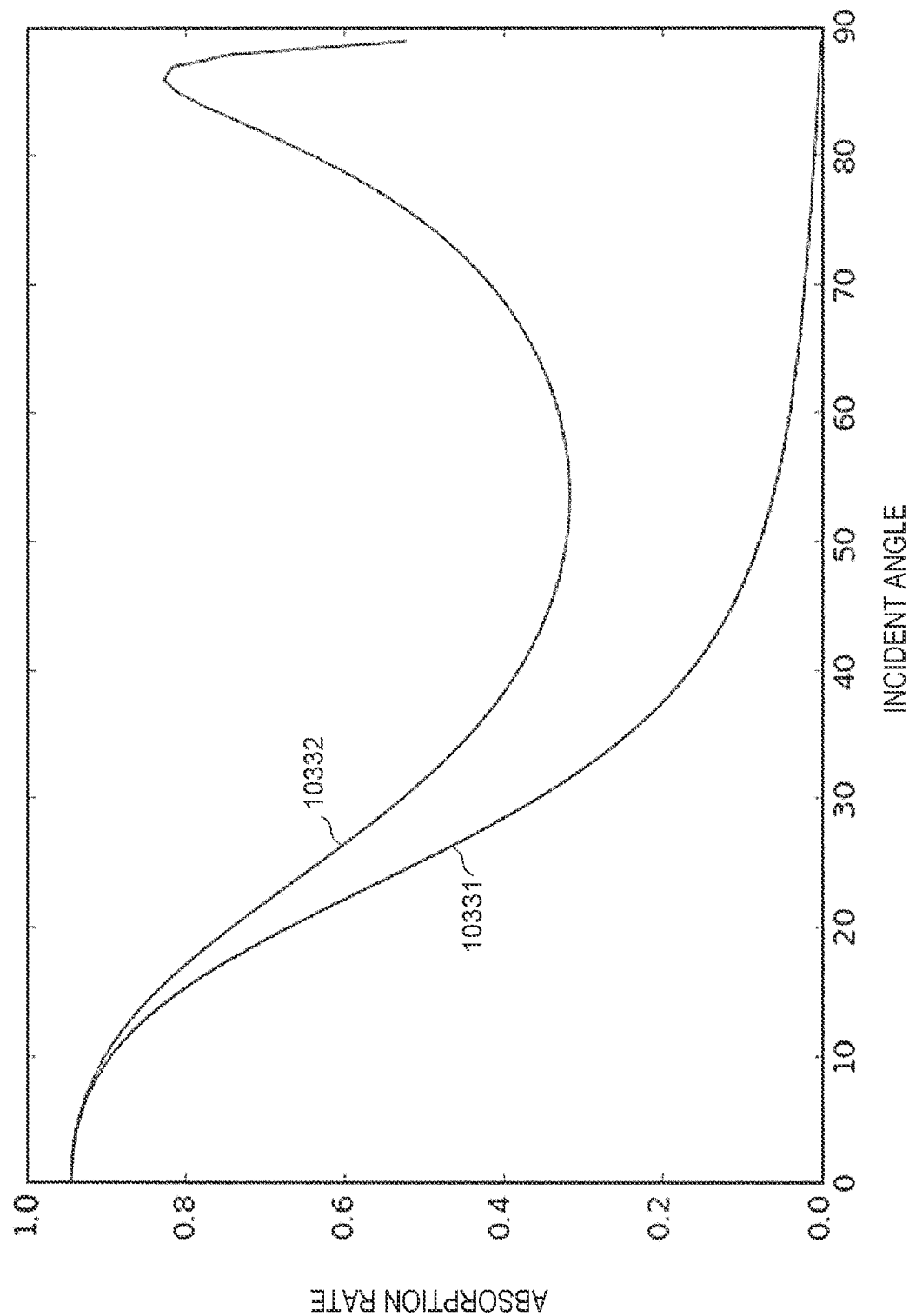

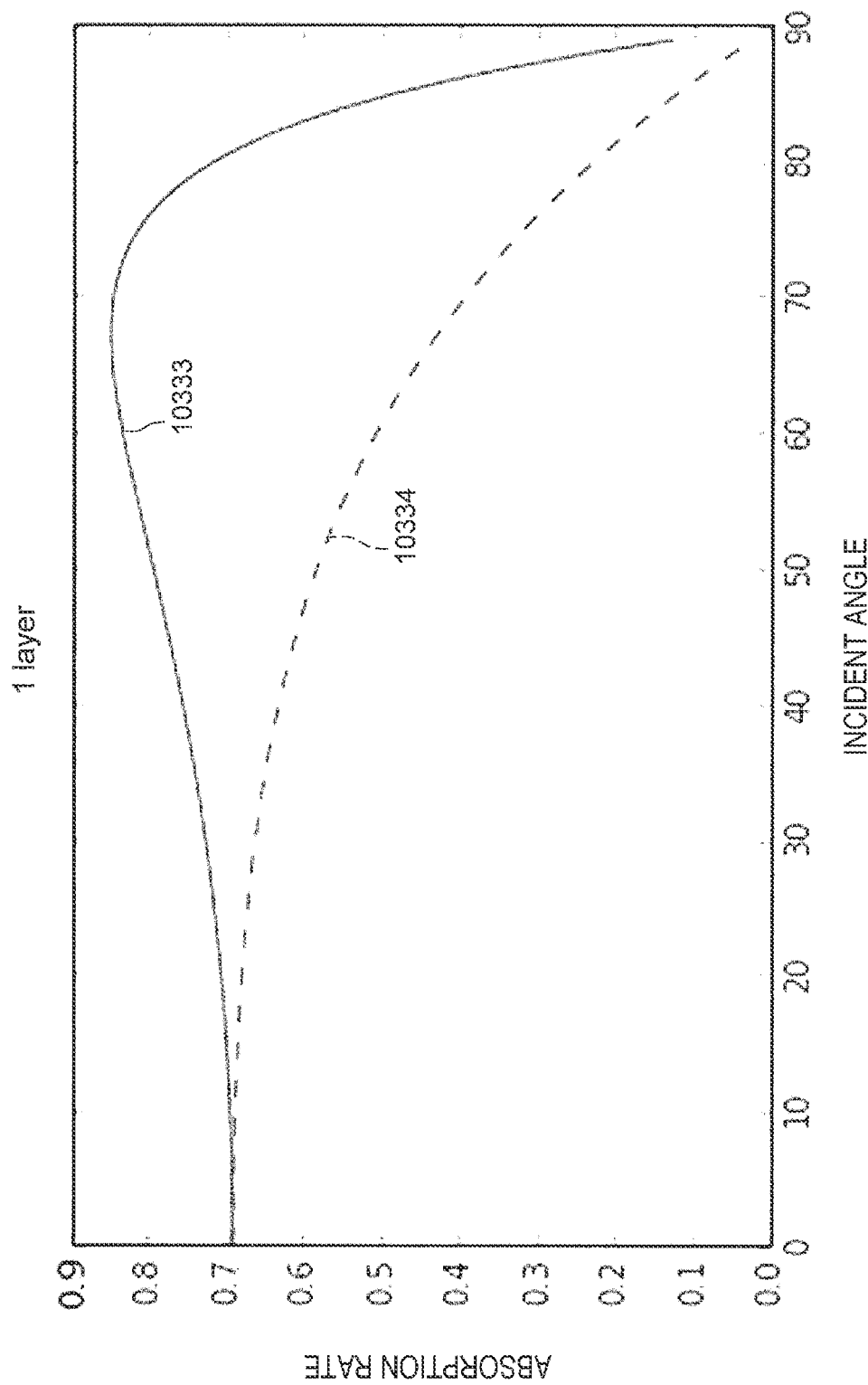

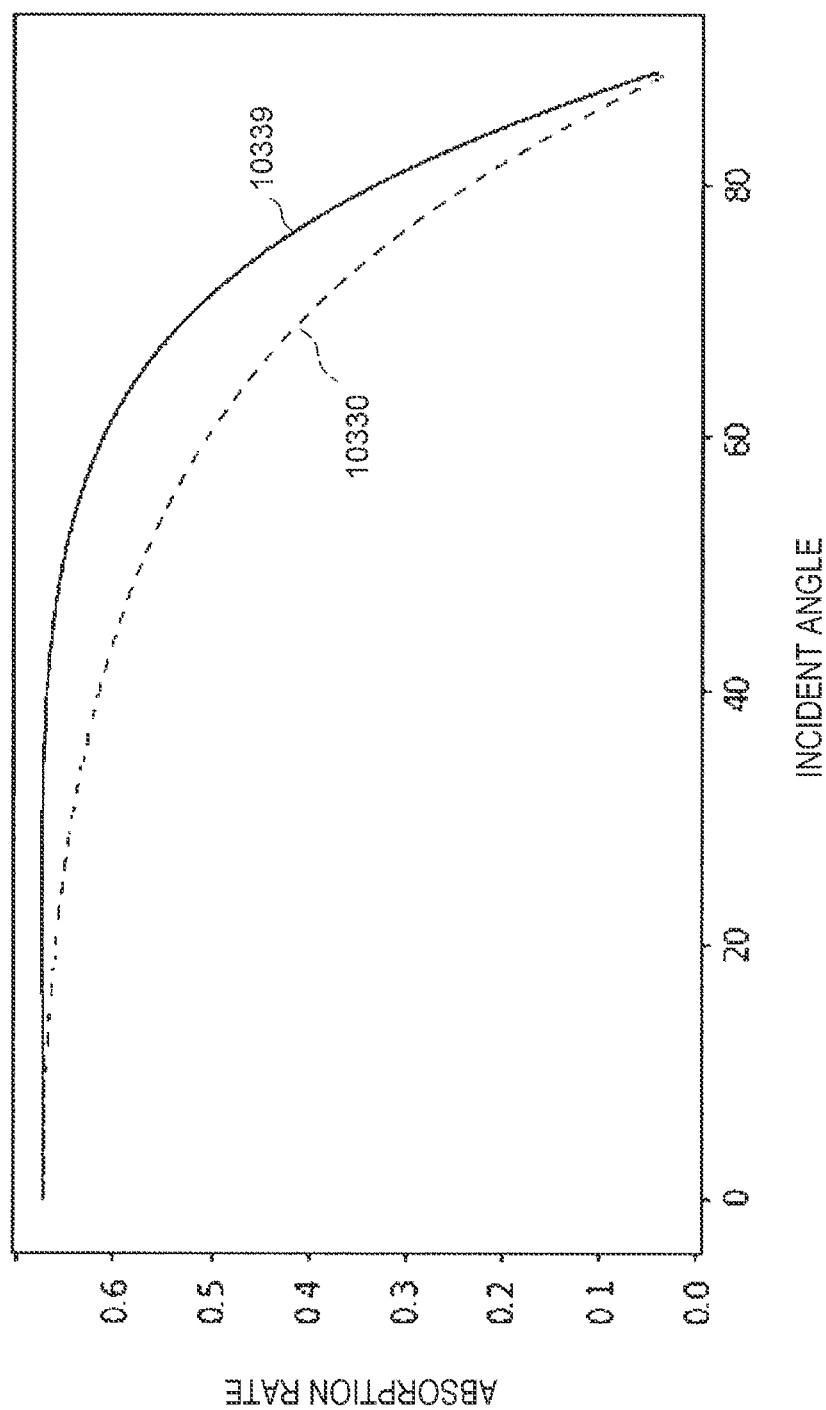

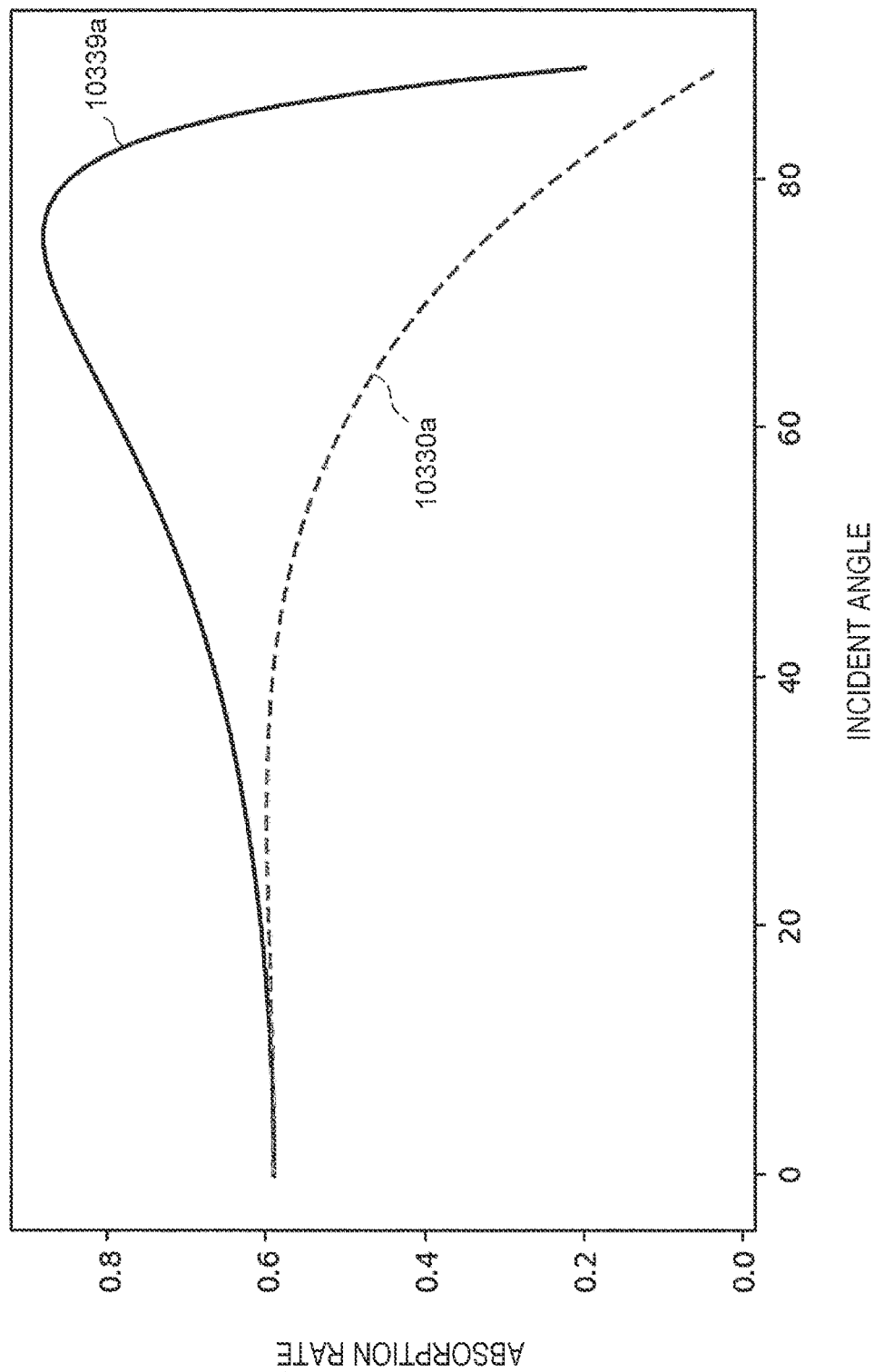

DEFECT INSPECTION APPARATUS AND DEFECT INSPECTION METHOD

TECHNICAL FIELD

The present invention relates to a defect inspection apparatus and a defect inspection method for inspecting a minute defect present on a sample surface, and determining and outputting a position, a type, and dimensions of the defect.

BACKGROUND ART

In a manufacturing line of a semiconductor substrate, a thin film substrate, or the like, defects present on a surface of the semiconductor substrate, the thin film substrate, or the like are inspected in order to maintain and improve a product yield. Defect inspection used in a process of manufacturing a semiconductor or the like is required to detect a minute defect. In order to optically detect this minute defect, it is required to irradiate the defect with a large quantity of illumination, collect as much scattered light generated from the defect as possible to form an image, and detect the defect. As a conventional technique for defect inspection, for example, a technique described in PTL 1 is known.

In PTL 1, in order to accurately detect a small number of photons from a minute defect, a plurality of photons are arranged while inclined with respect to a sample surface, and an image of linear illumination applied to the sample surface is formed at a sensor position by each detection system to perform defect determination. When the optical system is arranged such that all the reflected light from the defect can be detected, the operation distance between the detection unit and the linear illumination unit of the sample surface changes in the visual field. At this time, defocusing occurs, and the resolution of the image formed on the sensor surface decreases. In order to suppress this, PTL 1 describes that the optical axis of the oblique detection system 2001 is inclined by β from the horizontal since the higher order diffracted light is not detected as compared with the detection optical system unit 2000 that is not inclined with respect to the normal direction of the inspection object substrate W (paragraph 0054).

CITATION LIST

Patent Literature

PTL 1: JP 2007-033433 A

SUMMARY OF INVENTION

Technical Problem

However, in the method of PTL 1, the quantity of light detected by the sensor decreases, and there is a problem that high-sensitivity inspection cannot be realized. In particular, in a case where the wavelength of light incident on the sensor is short, the extinction coefficient is large and the reflectance is high in silicon used for a typical sensor, so that it is difficult to absorb light in the light receiving portion of the sensor.

It is generally known that an antireflection film is formed on a surface of a sensor in order to suppress reflection on the surface. However, unlike a case where light is incident from a normal direction of a general sensor surface, in a case where light is incident from an oblique direction, a reflectance of light on the sensor surface changes depending on a polarization characteristic of the incident light.

This is because the film thickness of the antireflection film that maximizes the light absorbed by the sensor light receiving portion changes depending on the polarization direction. In order to suppress this phenomenon, it is necessary to bring the incident angle of light on the sensor surface as close as possible to the normal direction of the sensor. This can be achieved by reducing the imaging magnification, typically to 1 or less.

However, when this method is used, the incident angle of the principal ray approaches the normal line, but the variation in the incident angle of the light incident on the sensor increases, and it becomes difficult to optimize the film thickness of the antireflection film. In addition, since the resolution of the sensor is determined by the product of the pixel size and the optical magnification, this resolution decreases, and it becomes difficult to detect a minute defect.

In addition, in the method of PTL 1, a method of inclining the sensor such that the long axis and the short axis of the slit beam are conjugate, that is, the sample surface and the sensor surface are conjugate when the azimuth θ with respect to the direction orthogonal to the short axis of the slit beam is detected from other than 0, 90, 80, and 270 degrees is disclosed. In this method, when the reflected light emitted at an angle close to a right angle with respect to the normal direction of the sample is detected, the light enters the sensor at an angle close to a right angle with respect to the normal direction of the sensor. Therefore, there is a problem that an antireflection film that absorbs light with high efficiency cannot be set in the sensor light receiving portion.

Therefore, the present invention solves the above-described problems of the prior art, and provides a defect inspection apparatus and a defect inspection method that realize high-sensitivity detection of a minute defect by performing high-resolution imaging detection in an inspection apparatus under a condition that an operation distance between a linear illumination unit and a detection unit on a sample surface is not constant.

Solution to Problem

A defect inspection apparatus according to the present invention includes: an illumination optical system configured to irradiate a sample surface with a linear illumination spot of light having a wavelength of any one of 240 nm to 293 nm; an illumination spot scanning unit configured to move the sample surface and scan the linear illumination spot in a lateral direction of the illumination spot; a light condensing unit configured to condense reflected light of the illumination spot from the sample surface; a polarization control unit configured to separate the light condensed by the light condensing unit depending on a polarization direction and rotate a polarization direction of light of a specific polarization direction after separation; an imaging unit configured to form an optical image by the light separated by the polarization control unit and rotated in the specific polarization direction; and a sensor unit configured to output the optical image as an electrical signal, the sensor unit including an array-shaped light receiving portion and an antireflection film at a position conjugate with the illumination spot with which the sample surface is irradiated. A first angle formed by an optical axis of the light condensing unit and a longitudinal direction of the linear illumination spot irradiated on the sample is 10 degrees or more and less than 80 degrees. A second angle formed by an arrangement direction of an array of the light receiving portion and an optical axis of the light condensing unit is 10 degrees or more and less than 80 degrees. The polarization control unit includes: a first wavelength plate that rotates a polarization direction of incident light; a polarization beam splitter that separates light whose polarization direction is rotated by the first wavelength plate depending on the polarization direction; and a second wavelength plate that rotates a polarization direction of light emitted from the polarization beam splitter.

The sensor unit of the defect inspection apparatus includes a first sensor unit and a second sensor unit. The polarization beam splitter splits light whose polarization direction is rotated by the first wavelength plate into light of a polarization component of S-polarized light and light of a polarization component of P-polarized light, and guides the light to a first optical path and a second optical path, respectively. The defect inspection apparatus further includes: a first polarization direction conversion unit that guides the S-polarized light guided to the first optical path to the first sensor unit; and a second polarization direction conversion unit that converts the P-polarized light guided to the second optical path to a direction of the S-polarized light and guides the converted light to the second sensor unit.

A defect inspection method of the present invention includes: irradiating, by an illumination optical system, a sample surface with a linear illumination spot of light having a wavelength of any one of 240 nm to 293 nm; driving, by an illumination spot scanning unit, the sample to scan the linear illumination spot in a lateral direction of the illumination spot; condensing, by a light condensing unit having an optical axis in which a first angle formed with a longitudinal direction of the linear illumination spot irradiated on the sample is 10 degrees or more and less than 80 degrees, reflected light of the illumination spot; separating, by a polarization control unit, light condensed by the light condensing unit depending on a polarization direction to rotate the polarization direction of the light of a specific polarization direction after separation in a direction of S-polarized light; forming, by an imaging unit, an optical image on a sensor unit from the light in the direction of the S-polarized light; outputting, by the sensor unit that includes an array-shaped light receiving portion at a position conjugate with the illumination spot irradiated on the sample surface in which a second angle formed by an arrangement direction of an array of the light receiving portion and an optical axis of the light condensing unit is 10 degrees or more and less than 80 degrees, and an antireflection film is formed, an optical image of the illumination spot as an electrical signal; causing, by the polarization control unit, a first wavelength plate to rotate a polarization direction of incident light; separating, by a polarization beam splitter, light of which the polarization direction is rotated by the first wavelength plate depending on the polarization direction; and rotating, by a second wavelength plate, the polarization direction of the light emitted from the polarization beam splitter.

Other means will be described in the form for carrying out the invention.

Advantageous Effects of Invention

According to the present invention, in the inspection apparatus under the condition that the operation distance between the linear illumination unit and the detection unit on the sample surface is not constant, it is possible to perform highly sensitive detection of a minute defect by performing high-sensitivity imaging detection.

BRIEF DESCRIPTION OF DRAWINGS

FIG. 11 is a graph illustrating a light absorption rate of a silicon substrate when a general antireflection film including a four-layer thin film is formed on the silicon substrate.

FIG. 12A is a graph illustrating a light absorption rate of a silicon substrate in a case where the antireflection film according to the first embodiment of the present invention is formed on the silicon substrate.

FIG. 12B is a graph illustrating a light absorption rate of a silicon substrate in a case where an antireflection film according to a modification of the first embodiment of the present invention is formed on the silicon substrate.

FIG. 12C is a graph illustrating a light absorption rate of a silicon substrate in a case where an antireflection film according to a modification of the first embodiment of the present invention is formed on the silicon substrate.

DESCRIPTION OF EMBODIMENTS

The present invention provides a defect inspection apparatus including: a sample holding unit that holds a sample to be inspected; an illumination optical system that irradiates the sample held by the sample holding unit with light of a predetermined wavelength; a detection optical system that includes a photoelectric conversion unit, collects reflected light from the sample irradiated with the light, and guides the collected reflected light to the photoelectric conversion unit; and a data processing unit that processes an output signal of the photoelectric conversion unit that detects the reflected light to extract position information of a foreign matter or a defect on the sample. The data processing unit obtains a deviation of an optical axis of an illumination spot, a deviation of a detection image on a photoelectric conversion surface due to a displacement of the sample to be inspected in a height direction, or a deviation of a detection timing on the basis of the reflected light of the sample to be inspected. The defect is detected on the basis of a signal intensity between the photoelectric conversion units or a signal obtained by correcting a timing deviation between signals acquired at different timings. The defect is detected on the basis of a signal between photoelectric conversion units or a signal obtained by correcting a positional deviation between signals acquired at different timings, thereby realizing inspection with high speed, high sensitivity, and good coordinate accuracy.

Hereinafter, embodiments of the present invention will be described with reference to the drawings. Note that the present invention is not limited to the embodiments described below, and includes various modifications. The embodiments described below are described in detail in order to describe the present invention in an easy-to-understand manner, and are not necessarily limited to those having all the described configurations. In addition, a part of the configuration of an embodiment can be replaced with another embodiment, and another embodiment can be added to the configuration of an embodiment. In addition, it is possible to add, delete, and replace other configurations for a part of the configuration of each embodiment.

In the following embodiment, a case where the present invention is applied to an inspection apparatus used for defect inspection executed in a manufacturing process of a semiconductor or the like will be described. By using the defect inspection apparatus according to the present invention, it is possible to realize (1) detection of minute defects,
(2) acquisition of inspection results regarding the number, position, dimension, and defect type of detected defects, and
(3) inspection of a large number of samples within a predetermined time.

First Embodiment

Figure 1:
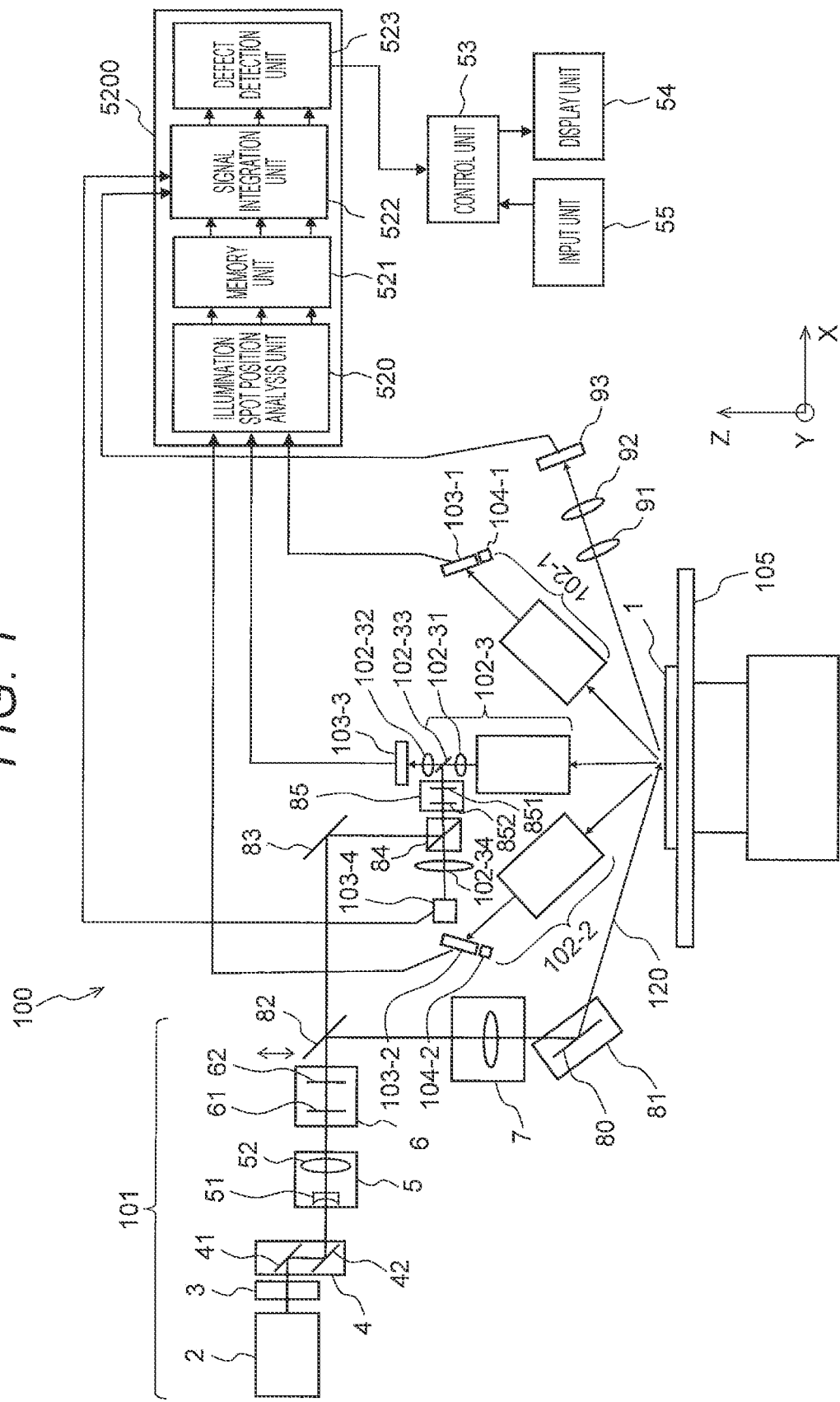
FIG. 1 is a block diagram illustrating an overall schematic configuration showing an embodiment of a defect inspection apparatus according to a first embodiment of the present invention.

FIG. 1 is an example of a schematic configuration diagram of a defect inspection apparatus 100 according to the present embodiment.

The defect inspection apparatus 100 according to the present embodiment is directed to a sample 1 having a flat surface on which no pattern is formed, and inspects defects such as foreign matters and dents on the surface of the sample 1.

The defect inspection apparatus 100 includes an illumination unit 101, condensing detection units 102-1 to 102-3, sensor units 103-1 to 103-3, sensor shift units 104-1 to 104-2, a stage 105, and a sensor unit 103-4. The defect inspection apparatus 100 further includes a condensing lens 91, an imaging lens 92, a two-dimensional sensor 93, a signal processing unit 5200, a control unit 53, a display unit 54, and an input unit 55.

The control unit 53 integrally controls the defect inspection apparatus 100 together with the display unit 54 that displays information and the input unit 55 that inputs data, instructions, and the like.

The sensor units 103-1 to 103-3 photoelectrically convert the optical images collected by the condensing detection units 102-1 to 102-3 and output the optical images as electrical signals. The wafer as the sample 1 is placed on the stage 105. The condensing detection units 102-1 to 102-3 control the polarization state of the light incident by condensing the reflected light of the illumination spot with which the sample 1 is irradiated by the illumination unit 101 to form an optical image on the array-shaped light receiving portions of the sensor units 103-1 to 103-3. The sensor unit 103-4 photoelectrically converts the optical image collected by the condensing detection unit 102-3 and outputs the optical image as an electrical signal. The two-dimensional sensor 93 photoelectrically converts the optical image formed by the condensing lens 91 and the imaging lens 92, and outputs the optical image as an electrical signal.

The illumination unit 101 appropriately includes a laser light source 2, an attenuator 3, an emitted light adjustment unit 4, a beam expander 5, a polarization control unit 6, and a condensing optical unit 7. The condensing detection unit 102-3 is also used as a condensing means of illumination light when light is incident from the normal direction of the sample 1.

Each of the sensor units 103-1 to 103-3 is a line sensor, and a complementary metal-oxide-semiconductor (CMOS) sensor or a charge coupled device (CCD) sensor is used. As the sensor unit 103-4 and the two-dimensional sensor 93, a two-dimensional CCD imaging sensor, a CMOS imaging sensor, or a position sensing detector (PSD) is used. Each of the sensor units 103-1 to 103-3 includes an array-shaped light receiving portion and an antireflection film at a position conjugate with the illumination spot with which the surface of the sample 1 is irradiated.

The sensor shift unit 104-1 physically shifts the sensor unit 103-1 to suppress the shift of the optical image due to the height variation. The sensor shift unit 104-2 has a similar function. For example, an ultrasonic linear actuator may be applied as the sensor shift units 104-1 and 104-2.

The signal processing unit 5200 includes an illumination spot position analysis unit 520, a memory unit 521, a signal integration unit 522, and a defect detection unit 523. The sensor units 103-1 to 103-3 photoelectrically convert the optical image, perform predetermined sampling, and output digital data by analog-digital conversion. Thereafter, the illumination spot position analysis unit 520 analyzes the position of the illumination spot from the digital data, and accumulates the position in the memory unit 521 as scattered light data. On the basis of the scattered light data, the signal integration unit 522 performs integration calculation between data having different positions of an illumination spot 20 in the same sensor unit 103, and further performs integration calculation between different sensor units 103.

The defect detection unit 523 extracts a high-frequency/high-luminance portion in the data after the integrated calculation as a defect.

The laser light beam emitted from the laser light source 2 is adjusted to a desired beam intensity by the attenuator 3, and is adjusted to a desired beam position and a beam traveling direction by the emitted light adjustment unit 4. Further, the laser light beam is adjusted to a desired beam diameter by the beam expander 5, is adjusted to a desired polarization state by the polarization control unit 6, and illuminates the inspection target region of the wafer sample 1.

The incident angle (inclination angle with respect to the normal direction of the surface of the sample 1) of the illumination light with respect to the surface of the sample 1 is determined by the positions and angles of reflection mirrors 80 and 82 disposed in the optical path of the illumination unit 101. An incident angle of the optical axis 120 of the illumination light is set to an angle suitable for detection of a minute defect. An adjustment mechanism 81 adjusts the angle of the reflection mirror 80.

As the illumination incident angle of the laser light beam is larger, that is, the illumination elevation angle (the angle formed by the surface of the sample 1 and the optical axis 120 of the illumination light) is smaller, the scattered light (called haze) from minute irregularities on the surface of the sample 1, which becomes noise with respect to the scattered light from a minute foreign matter on the surface of the sample 1, is weakened. Therefore, a laser light beam having a large illumination incident angle is suitable for detecting a minute defect.

Therefore, when the scattered light from minute irregularities on the surface of the sample 1 interferes with minute defect detection, the incident angle of illumination light on the surface of the sample 1 is preferably set to 75 degrees or more and less than 90 degrees (elevation angle of 15 degrees or less and more than 0 degrees).

On the other hand, in obliquely incident illumination, the smaller the illumination incident angle is, the larger the absolute amount of the scattered light from the minute foreign matter is. Therefore, when the scattered light from the defect interferes with minute defect detection, the incident angle of the illumination light on the surface of the sample 1 is preferably set to 60 degrees or more and 75 degrees or less (elevation angle of 15 degrees or more and 30 degrees or less).

In addition, when obliquely incident illumination is performed, the polarized light of the illumination is set to P-polarized light by the polarization control of the polarization control unit 6 of the illumination unit 101, so that the scattered light from defects on the surface of the sample 1 increases as compared with other polarized light. In addition, in a case where the scattered light from the minute irregularities on the surface of the sample 1 interferes with the minute defect detection, the polarized light of the illumination is S-polarized light, so that the scattered light from the minute irregularities on the surface of the sample 1 is reduced as compared with other polarized light. In addition, it is also possible to set the polarization of the illumination to 45 degree polarization which is an intermediate between P and S or circularly polarized light.

The reflection mirror 82 can be taken in and out from the optical path by being moved up and down in the Z-axis direction using a drive mechanism (not illustrated). When the reflection mirror 82 is removed from the optical path, the illumination light emitted from the polarization control unit 6 is incident on the sample 1 from the vertical direction via a reflection mirror 83, a polarization beam splitter 84, a polarization control unit 85, and the condensing detection unit 102-3. The condensing detection unit 102-3 includes a reflection mirror 102-33 at its pupil portion.

Similarly to the polarization control unit 6 to be described later, the polarization control unit 85 includes a ¼ wavelength plate 851 and a ½ wavelength plate 852, and can control arbitrary polarization.

Under the condition that the reflection mirror 82 is removed from the optical path and the illumination is vertically incident, the polarization control unit 85 sets the illumination light to be incident on the condensing detection unit 102-3 as circularly polarized light.

The light reflected by the surface of the sample 1 is branched in the optical path by the reflection mirror 102-33. The reflected light from the sample 1 reflected by the reflection mirror 102-33 toward the polarization control unit 85 is converted into linearly polarized light by the ¼ wavelength plate 851 of the polarization control unit 85. Then, the light is guided to an imaging lens 102-34 by the polarization beam splitter 84 and detected by the sensor unit 103-4.

Figure 2A:
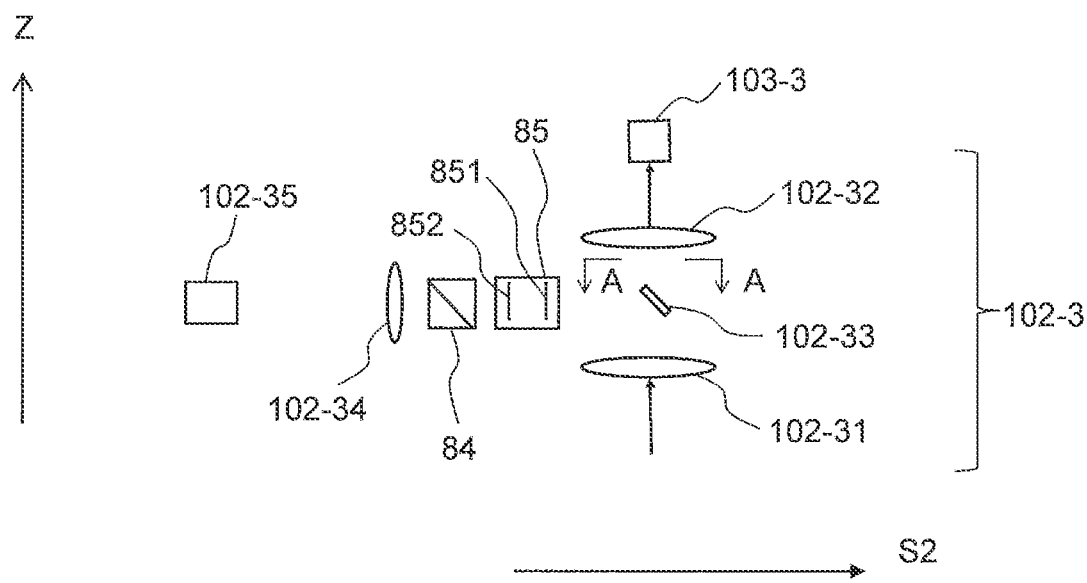
FIG. 2A is a view illustrating an arrangement of an optical system.
Figure 2B:
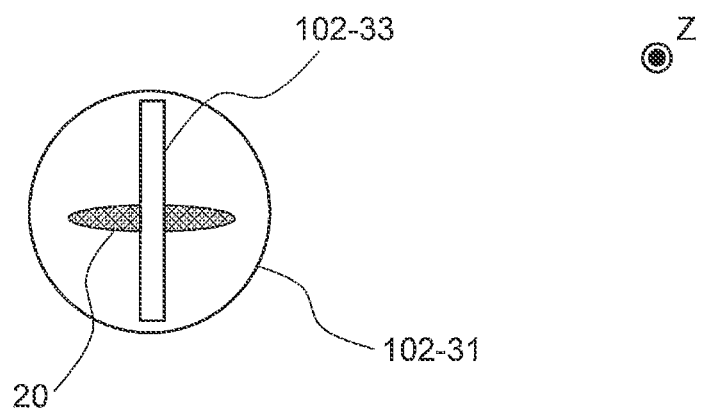
FIG. 2B is a view illustrating an arrangement of an optical system.

FIGS. 2A and 2B illustrate a detailed configuration of the condensing detection unit 102-3. FIG. 2B is an arrow view of an A-A cross section in FIG. 2A.

An objective lens 102-31, the reflection mirror 102-33, and an imaging lens 102-32 are disposed on the optical axis of the condensing detection unit 102-3, and are configured to form an optical image on the sensor unit 103-3. An upward arrow in FIG. 2A is a Z-axis, and a lateral arrow is a direction S2 indicating a scanning direction.

As illustrated in FIG. 2B, the illumination spot 20 is illumination light with which the surface of sample 1 is irradiated, and has a linear intensity distribution. The reflection mirror 102-33 has a long shape in the short diameter direction of the illumination spot 20 and a short shape in the long diameter direction.

The reflected light incident on the reflection mirror 102-33 from the sample 1 is guided to the polarization control unit 85. The reflected light having passed through the periphery of the reflection mirror 102-33 is incident on the imaging lens 102-32.

As illustrated in FIG. 1, under the condition of oblique illumination in which the reflection mirror 82 is inserted into the optical path, the quantity of light detected by the sensor unit 103-4 is weak. Therefore, in the present embodiment, the two-dimensional sensor 93 is used instead of the sensor unit 103-4. That is, in the present embodiment, the reflected light directly reflected by the surface of the sample 1 is incident on the condensing lens 91 and the imaging lens 92 to form an image on the two-dimensional sensor 93.

The defect inspection apparatus 100 monitors the illumination spot 20 using the light detected by the sensor unit 103-4 or the two-dimensional sensor 93.

The laser light source 2 emits laser light having a wavelength that hardly penetrates the inside of the sample 1 in order to detect minute defects in the vicinity of the surface of the sample 1. That is, the laser light source 2 emits an ultraviolet or vacuum ultraviolet laser beam having a short wavelength (wavelength of 355 nm or less) at a high output of 2 W or more. In the present embodiment, a laser beam having a wavelength of 266 nm is applied. The present invention is not limited to this, and any wavelength included in near ultraviolet rays having a wavelength of 200 to 380 nm or vacuum ultraviolet rays having a wavelength of 10 to 200 nm may be used.

The output beam diameter of the illumination unit 101 is about 1 mm. In order to detect a defect inside the sample 1, a wavelength that oscillates a visible or infrared laser beam is used as a wavelength that easily penetrates into the sample 1.

Figure 3:
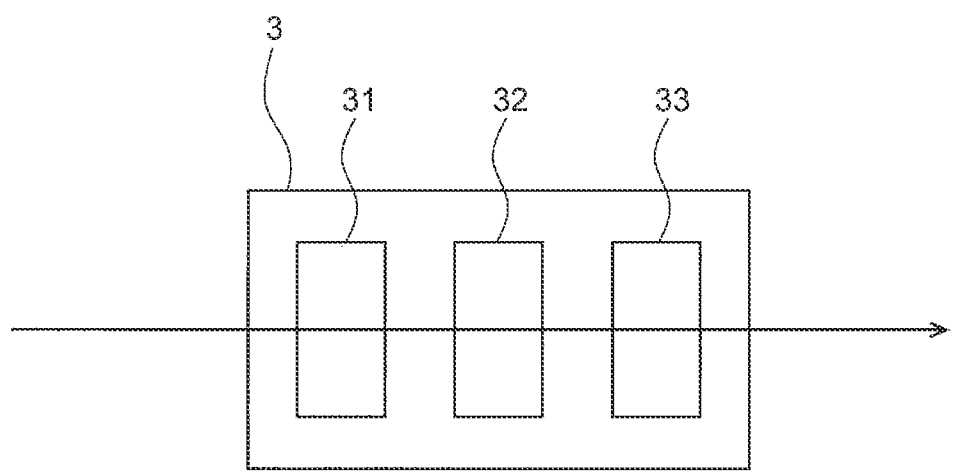
FIG. 3 is a view illustrating an embodiment of the defect inspection apparatus, and is a block diagram illustrating an internal configuration of an attenuator.

FIG. 3 is a view illustrating a configuration of an attenuator 3.

The attenuator 3 appropriately includes a first polarizing plate 31, a ½ wavelength plate 32 rotatable around the optical axis of the illumination light, and a second polarizing plate 33. The light incident on the attenuator 3 is converted into linearly polarized light by the first polarizing plate 31, and the polarization direction is rotated in an arbitrary direction according to the slow axis azimuth of the ½ wavelength plate 32, and passes through the second polarizing plate 33.

By controlling the azimuth angle of the ½ wavelength plate 32, the light intensity is reduced at an arbitrary ratio. When the linear polarization degree of the light incident on the attenuator 3 is sufficiently high, the first polarizing plate 31 is not necessarily required. As the attenuator 3, one in which the relationship between the input signal and the light reduction ratio is calibrated in advance is used. As the attenuator 3, a neutral density (ND) filter having a gradation density distribution can be used, or an ND filter having a plurality of different densities can be switched and used.

Returning to FIG. 1, the description will be continued. The emitted light adjustment unit 4 includes a plurality of reflection mirrors 41 and 42. Here, an embodiment in the case of including two reflection mirrors 41 and 42 will be described, but the present invention is not limited thereto, and three or more reflection mirrors may be appropriately used. Here, a three-dimensional orthogonal coordinate system (XYZ coordinates) is provisionally defined, and it is assumed that light incident on the reflection mirror 41 travels in the +X direction.

The reflection mirror 41 is installed so as to deflect the incident light in the +Y direction. That is, the incident light is incident on and reflected from the reflection mirror 41 in the XY plane.

The reflection mirror 42 is installed so as to deflect the light reflected by the reflection mirror 41 in the +Z direction. That is, the incident light is incident and reflected in the YZ plane in the reflection mirror 42. Translation and tilt angle adjustment are performed on each of the reflection mirrors 41 and 42 using a mechanism (not illustrated). As a result, the position and traveling direction (angle) of the light emitted from the emitted light adjustment unit 4 are adjusted.

In this manner, the incident/reflection surface (XY plane) of the reflection mirror 41 and the incident/reflection surface (YZ plane) of the reflection mirror 42 are orthogonal to each other. Thus, the position and angle adjustment in the XZ plane and the position and angle adjustment in the YZ plane of the light (traveling in the +Z direction) emitted from the emitted light adjustment unit 4 can be performed independently.

The beam expander 5 has lens groups 51 and 52, and has a function of expanding the diameter of the incident parallel light flux. The beam expander 5 is of a Galileo type in which the lens group 51 is a concave lens and the lens group 52 is a convex lens. The beam expander 5 is installed on a translation stage of two or more axes (not illustrated), and can be adjusted in position so that a predetermined beam position and a center thereof coincide with each other. In addition, the tilt angle adjustment function of the entire beam expander 5 is provided so that the optical axis of the beam expander 5 coincides with a predetermined beam optical axis.

By adjusting the interval between the lens groups 51 and 52, it is possible to control the magnification ratio of the light flux diameter (zoom mechanism). When the light incident on the beam expander 5 is not parallel, the diameter of the light flux is simultaneously expanded and collimated (quasi-collimated light of the light flux) by adjusting the interval between the lens groups 51 and 52.

The collimation of the light flux may be performed by installing a collimating lens independently of the beam expander 5 upstream of the beam expander 5. The magnification of the beam diameter by the beam expander 5 is about 5 times to 10 times, and the beam having a beam diameter of 1 mm emitted from the light source is enlarged to about 5 mm to 10 mm.

The polarization control unit 6 includes a ½ wavelength plate 61 and a ¼ wavelength plate 62, and controls the polarization state of the illumination light to an arbitrary polarization state.

Figure 4:
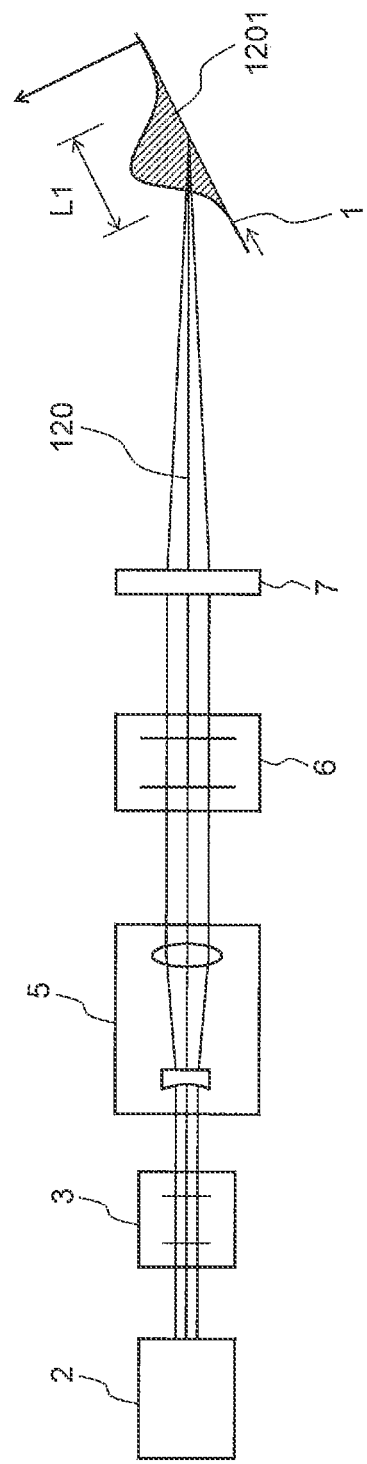
FIG. 4 illustrates a cross-sectional view of an incident surface of obliquely incident illumination.
Figure 5:
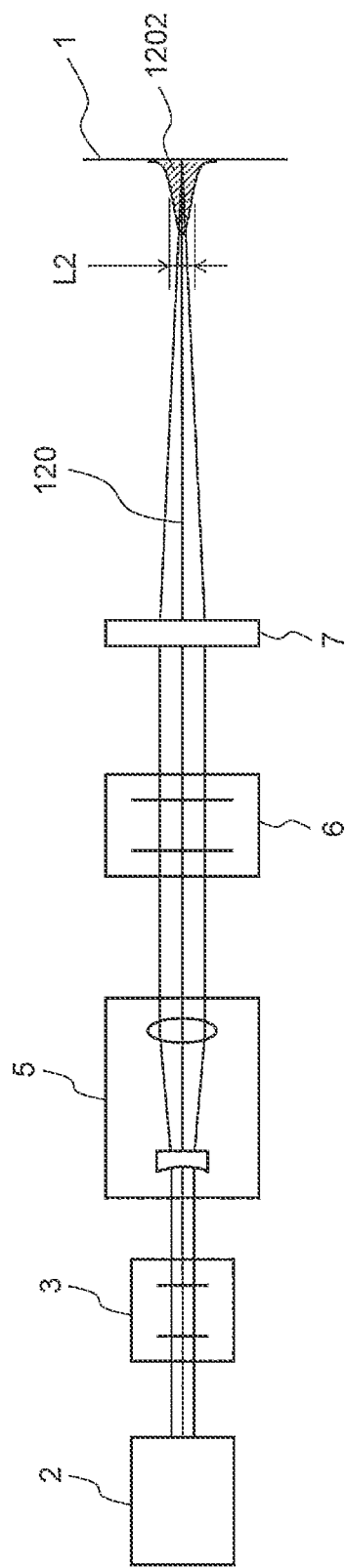
FIG. 5 illustrates a cross-sectional view of a plane including a normal line of a sample surface and perpendicular to an incident surface of obliquely incident illumination.

FIGS. 4 and 5 are schematic diagrams illustrating a positional relationship between the optical axis 120 of the illumination light guided from the illumination unit 101 to the surface of the sample 1 and the illumination intensity distribution shape. The configuration of the illumination unit 101 in FIGS. 4 and 5 illustrates a part of the configuration of the illumination unit 101 described in FIG. 1, and the emitted light adjustment unit 4, the reflection mirror 82, the adjustment mechanism 81, and the like described in FIG. 1 are omitted.

FIG. 4 is a schematic view of a cross section of an incident surface of obliquely incident illumination. Here, the incident surface is a surface including the optical axis 120 of the illumination light and the normal line of the surface of the sample 1.

The obliquely incident illumination is inclined with respect to the surface of the sample 1 in the incident surface. The illumination unit 101 creates a uniform illumination intensity distribution in the incident surface. As illustrated in an illumination intensity distribution 1201 on the right side of FIG. 4, the illumination intensity has a Gaussian intensity distribution in the linearly illuminated region on the surface of the sample 1, and the length of the beam width L1 defined by 13.5% of the peak is about 25 μm to 4 mm.

FIG. 5 illustrates a schematic diagram of a cross section including a normal line of the surface of the sample 1 and perpendicular to the incident surface of obliquely incident illumination.

In this plane, the illumination intensity distribution on the surface of the sample 1 forms an illumination intensity distribution in which the peripheral intensity is weak with respect to the center of the optical axis 120 on the surface of the sample 1 as illustrated in an illumination intensity distribution 1202 on the right side of FIG. 5. More specifically, a Gaussian distribution reflecting the intensity distribution of the light incident on the condensing optical unit 7 or an intensity distribution similar to the Bessel function of the first kind of order 1 or the sinc function reflecting the opening shape of the condensing optical unit 7 is obtained.

In order to reduce the haze generated from the surface of the sample 1, the length L2 of the in-plane illumination intensity distribution is shorter than the length of the portion where the illumination intensity is uniform in the incident surface, and is about 1.0 µm to 20 µm. The length L2 of the illumination intensity distribution refers to a length of a region having an illumination intensity of 13.5% or more of the maximum illumination intensity.

Hereinafter, the illuminance distribution shape (illumination spot 20) formed on the surface of the sample 1 by the illumination unit 101 and the sample scanning method will be described with reference to FIGS. 6 and 7. The sample 1 is assumed to be a circular semiconductor silicon wafer. The stage 105 includes a translation stage, a rotary stage, and a Z stage (none of which are illustrated) for adjusting the height of the sample surface.

Figure 6:
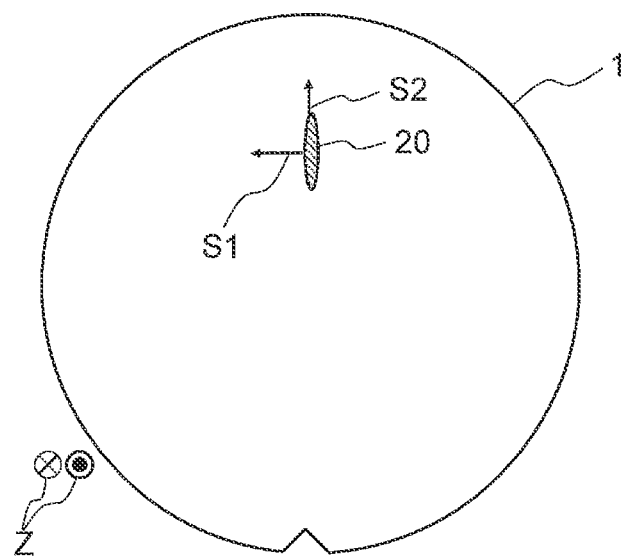
FIG. 6 is a plan view of a sample showing a state in which an illumination spot is projected on the sample.

As illustrated in FIG. 6, the illumination spot 20 has a long illumination intensity distribution in one direction as described above, and the illumination intensity distribution is oriented in the direction S2 (direction L1 in FIG. 4). The direction S1 (direction L2 in FIG. 5) is orthogonal to the direction S2. The illumination spot 20 is operated in the circumferential direction S1 of the circle about the rotation axis of the rotary stage by the rotary motion of the rotary stage constituting the stage 105. The illumination spot 20 is scanned in the direction S2 of the translation stage by the translation movement of the translation stage.

Figure 7:
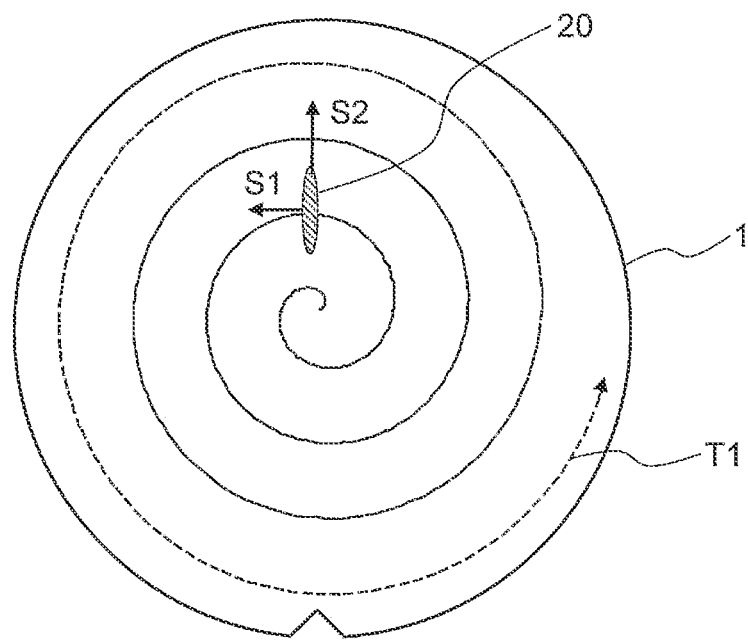
FIG. 7 is a plan view of a wafer showing a first example showing a trajectory of an illumination spot by spiral scanning.

As illustrated in FIG. 7, when the sample 1 is continuously rotated, scanning is performed by a distance equal to or less than the length of the illumination spot 20 in the longitudinal direction in the scanning direction S2 during one rotation of the sample 1, whereby the illumination spot 20 draws a spiral trajectory T1 on the sample 1, and the entire surface of the sample 1 is scanned.

Figure 8:
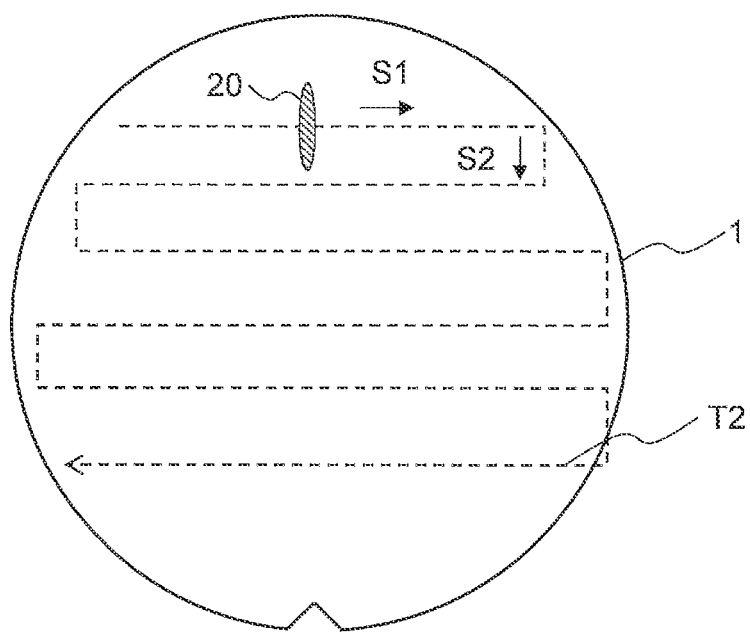
FIG. 8 is a plan view of a wafer showing a second example showing a trajectory of an illumination spot by translational scanning.

FIG. 8 illustrates scanning of the illumination spot 20 in a configuration including two translation stages instead of the rotary stage. By scanning the two-axis translation stage in the direction S1, the illumination spot 20 scans the sample surface in a band shape with the length of the illumination spot 20 in the direction S1 at a constant speed. The entire surface of the sample 1 is scanned while a trajectory T2 is drawn by repeatedly moving the translation stage by the scanning width in the direction S2 at the end portion of the sample 1 to move the visual field and performing scanning at a constant speed in the direction opposite to the direction S1.

Figure 9A:
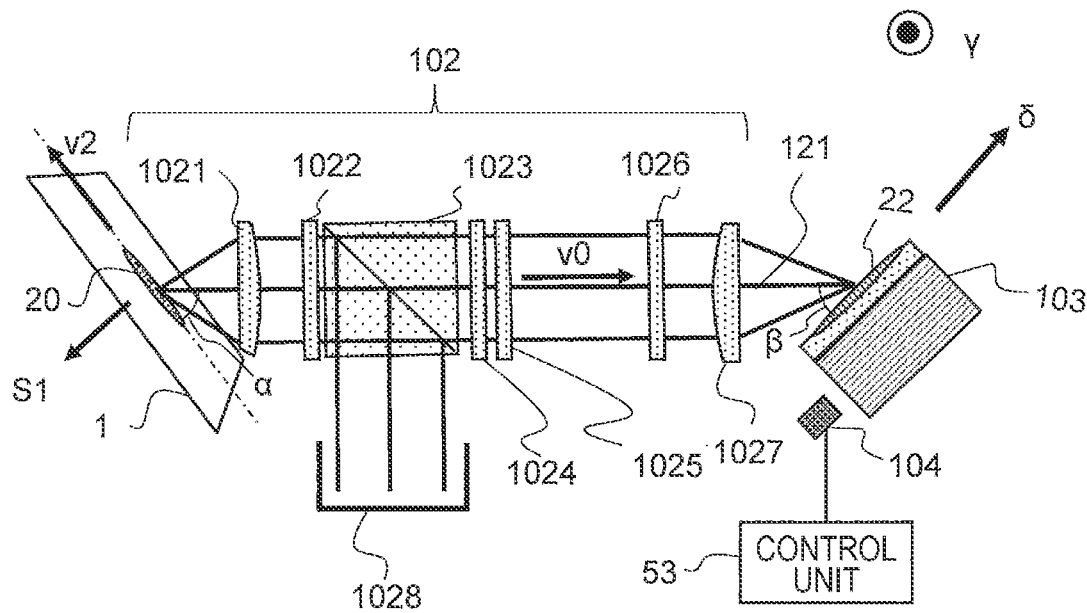
FIG. 9A is a block diagram of a configuration of a detection optical system as viewed from a cross section in an illumination longitudinal direction of linear illumination.
Figure 9B:
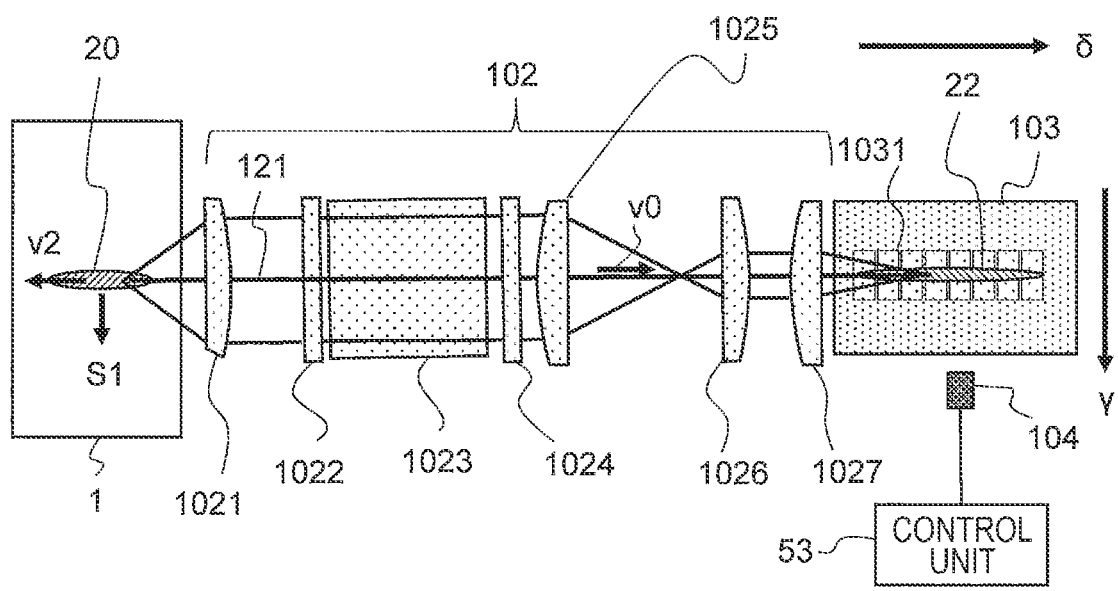
FIG. 9B is a block diagram illustrating a configuration of a detection optical system from a cross section in an illumination longitudinal direction of linear illumination.

FIGS. 9A and 9B are block diagrams of the condensing detection unit 102 that detects an optical image 22 of the illumination spot 20 from the side and the upper side of the light receiving portion of the sensor unit 103.

This corresponds to the condensing detection units 102-1 and 102-2. FIG. 9A is a view of the light receiving portions of the sensor units 103-1 and 103-2 as viewed from the arrangement direction of the light receiving portions and the +Y direction in FIG. 1. FIG. 9B is a view of the arrangement of the light receiving portions 1031 of the sensor units 103-1 and 103-2 as viewed from the orthogonal direction and the −Z direction in FIG. 1. A condensing lens 1021 is a telecentric optical system so that the magnification does not change even when the operation distance changes.

The condensing detection unit 102 includes a condensing lens 1021, a ½ wavelength plate 1022, a polarization beam splitter 1023, a ½ wavelength plate 1024, cylindrical lenses 1025 and 1026, and an imaging lens 1027 in the direction of an optical axis 121. The condensing detection unit 102 includes a beam diffuser 1028 in the direction of the light separated by the polarization beam splitter 1023.

The condensing detection unit 102 condenses light by the condensing lens 1021 and controls a polarization direction thereof by the ½ wavelength plate 1022. The ½ wavelength plate 1022 is rotatable by a drive unit (not illustrated). The polarization beam splitter 1023 splits the optical path by polarization. The combination of the ½ wavelength plate 1022 and the polarization beam splitter 1023 makes it easy to separate the optical signal indicating the defect of the sample and the optical signal (For example, roughness scattered light from the sample surface) inhibiting the defect detection of the sample. That is, the condensing detection unit 102 condenses the reflected light of the illumination spot from the surface of the sample 1 and controls the polarization state of the incident light to form an optical image.

In this method, the optical axis 121 is inclined with respect to the normal direction of the light receiving portion 1031. Therefore, in this method, unlike a normal case where light is emitted from the normal direction of the light receiving portion, the light absorption rate of the light receiving portion 1031 changes due to polarized light. The ½ wavelength plate 1024 controls the polarization direction so as to increase the light absorption rate of the light receiving portion 1031. The pair of cylindrical lenses 1025 and 1026 constitutes a cylindrical beam expander, and makes the spread in the lateral direction γ of the optical image 22 formed by the illumination spot 20 smaller than the spread in the longitudinal direction of the optical image 22.

The imaging lens 1027 forms the optical image 22 of the illumination spot 20 on the light receiving portion 1031 of the sensor unit 103. The beam diffuser 1028 prevents unnecessary light from becoming stray light.

The light receiving portion 1031 of the sensor unit 103 is disposed in parallel to the longitudinal direction of the optical image 22 in which the linear illumination spot 20 irradiated on the surface of the sample 1 is formed on the light receiving portion 1031 by the condensing detection unit 102. As a result, the sensor unit 103 captures the optical image 22 and outputs the captured image as an electrical signal. The sensor unit 103 includes an array-shaped light receiving portion and an antireflection film at a position conjugate with the illumination spot with which the surface of the sample 1 is irradiated. The light receiving surface of the sensor unit 103 is not conjugate with the sample surface in the lateral direction γ. However, since the lateral direction γ is also the lateral direction of the illumination spot 20, the image height of the optical image 22 is low, and the defocusing hardly occurs. Therefore, by increasing the imaging magnification of the optical image 22 in the lateral direction γ, the variation in the incident angle on the light receiving portion 1031 can be reduced.

Assuming that the optical axis 121 for detecting the light of the condensing detection unit 102 is shifted by an angle θ with respect to the normal direction of the sample 1 and an angle φ with respect to the longitudinal direction of the illumination spot 20, this optical axis 121 is expressed by a vector v0 of the following Expression (1) in the three-dimensional space.

[Math. 1]

$$v0 = [\sin\theta\cos\phi\ \sin\theta\sin\phi\ \cos\theta] \quad (1)$$

The angle α formed by the vector v0 and the longitudinal direction of the illumination spot 20 is obtained by the following Expression (2).

[Math. 2]

$$\alpha = \arccos(\sin\theta\cos\phi) \quad (2)$$

At this time, the defect inspection apparatus 100 detects a section of 2L in the longitudinal direction of the illumination spot 20 by the sensor unit 103. Depending on the position x from the center of the visual field, the operation distance changes as ΔZ expressed in the following Expression (3).

[Math. 3]

$$\Delta z = x(\sin\theta\cos\phi), |x| < L \quad (3)$$

An imaging magnification M is determined by the condensing lens 1021 and the imaging lens 1027. The position of the image formed here is expressed by the following Expression (4).

[Math. 4]

$$\Delta Z = M^2 x(\sin\theta\cos\phi), |x| < L \quad (4)$$

In general, the line sensor is disposed so as to be orthogonal to the optical axis that is the center of the light flux emitted by the imaging lens. However, in the present embodiment, by inclining the sensor unit 103, imaging detection without defocusing is realized regardless of a change in the visual field of the operation distance. At this time, a pixel arrangement vector v1 of the optical axis 121 and the light receiving surface incident on the sensor unit 103 is set so as to be in the longitudinal direction of the illumination spot 20 and the plane stretched by a vector v0 and satisfy the following Expression (5).

[Math. 5]

$$v0 \cdot v1 = M\sin\theta\cos\phi \quad (5)$$

According to Expression (5), when the imaging magnification M increases, the inner product of the vector v0 and the vector v1 increases. That is, the angle β formed by the vector v0 and the vector v1 decreases, and the imaging performance deteriorates. The angle β can be obtained by an inverse cosine function of Expression (5).

For example, in a case where the angle α is 60°, when the imaging magnification M is 2, the incident angle is 0°, and imaging cannot be performed even if the incident numerical aperture is 0. In order to prevent this, the imaging magnification M is set to twice or less.

Under this condition, the angle formed by the vector v1 and the optical axis 121 incident on the sensor unit 103 from the imaging lens 1027 can be maximized. In a case where the numerical aperture of the incident light flux of the condensing lens 1021 is N, the spread of the light flux emitted to the sensor unit 103 is a reciprocal of the imaging magnification M.

As described above, since the imaging magnification M is set to twice or less, in particular, when a lens having a large numerical aperture is adopted as the condensing lens 1021, light from a wide direction is incident on the sensor unit 103.

Due to the characteristics of the antireflection film 1033 described later with reference to FIGS. 11 and 12A to 12E, when the incident angle range of light to the sensor unit 103 is wide, the light absorption rate of the sensor unit 103 decreases, and it becomes difficult to achieve high sensitivity. Therefore, the imaging magnification M is set to one time or more. As a result, the angle β becomes smaller than the angle α, and typically becomes smaller by 5 degrees or more by giving a magnification of about 1.2.

Here, the imaging magnification M is set to twice or less in an imaging magnification $M_X$ in the arrangement direction of the array-shaped light receiving portions of the sensor unit 103. With respect to an imaging magnification $M_Y$ in the lateral direction γ orthogonal to the arrangement direction of the array-shaped light receiving portions of the sensor unit 103, the lateral direction of the optical image 22 has a low image height and is less likely to be defocused, so that there is no such restriction. By increasing the imaging magnification $M_Y$, the variation in the incident angle of the light incident on the light receiving portion 1031 of the sensor unit 103 decreases in the lateral direction γ. Therefore, the sensitivity of the sensor unit 103 can be improved by improving the light absorption rate of the light receiving portion 1031. Therefore, it is desirable to set the imaging magnification $M_Y$ higher than the imaging magnification $M_X$.

In the cylindrical lenses 1025 and 1026 of the present embodiment, the imaging magnification $M_Y$ in the lateral direction of the illumination spot 20 is higher than the imaging magnification $M_X$ in the longitudinal direction. On the other hand, by increasing the imaging magnification, the sensitivity of the sensor unit 103 can be improved.

A normal direction n of the sample 1 is not typically orthogonal to the longitudinal direction δ or the lateral direction γ of the light receiving portion 1031 in FIG. 9A when the light receiving portion 1031 of the sensor unit 103 is viewed from the side.

Figure 9C:
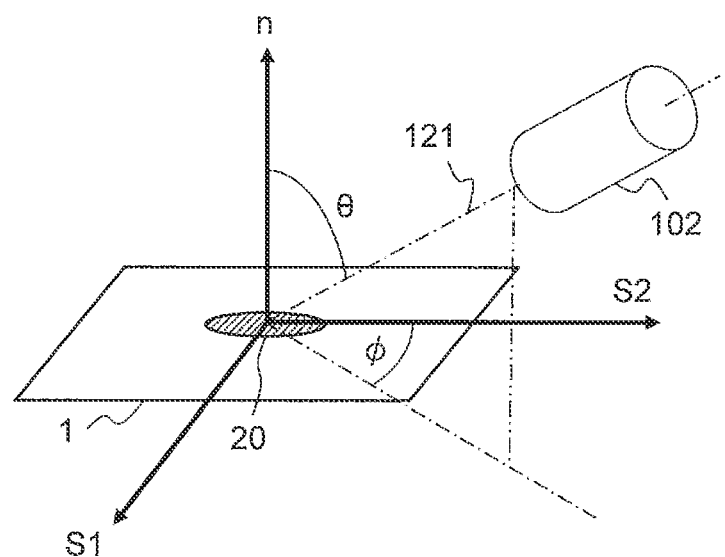
FIG. 9C is a view illustrating various vectors on the sample surface.

FIG. 9C illustrates a schematic diagram of stereoscopic detection of the sample 1.

The optical axis 121 of the condensing detection unit 102 is inclined by an angle θ with respect to the normal direction n of the sample 1. Projection of the optical axis 121 onto the sample surface is inclined by an angle φ with respect to the longitudinal direction S2 of the illumination spot 20.

Figure 9D:
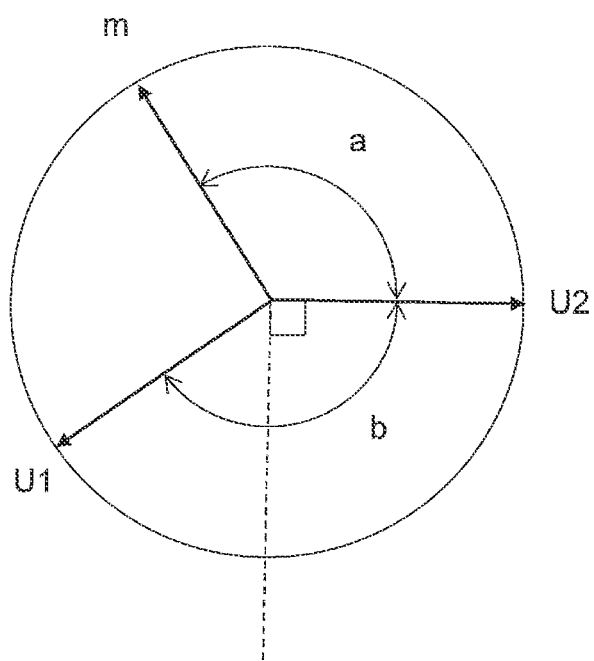
FIG. 9D is a view illustrating various vectors on the light receiving surface of a sensor unit.
Figure 9E:
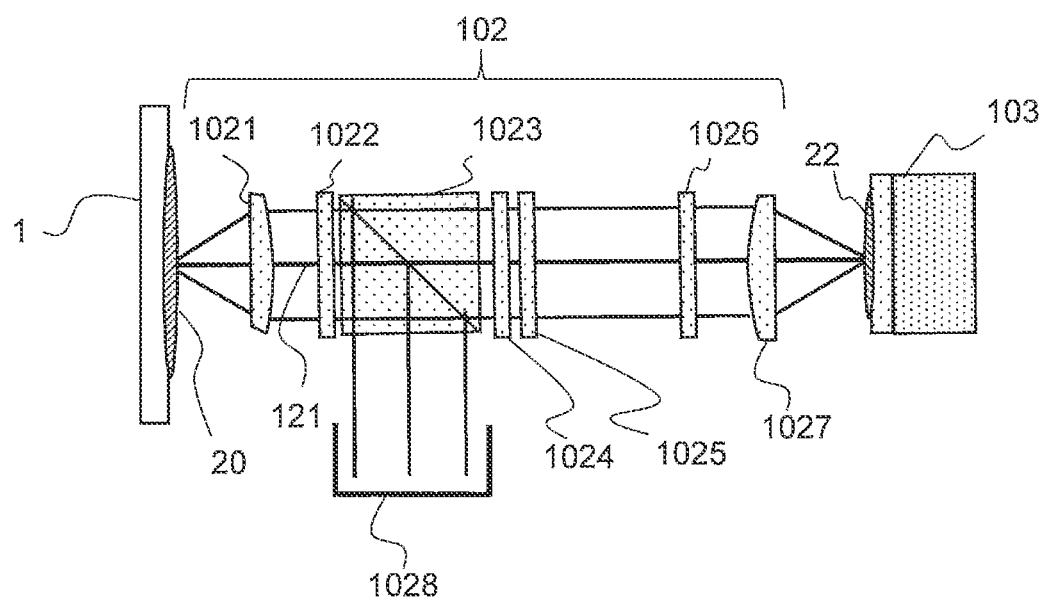
FIG. 9E is a block diagram illustrating a configuration of a detection optical system from a cross section in an illumination longitudinal direction of linear illumination.

FIG. 9D illustrates a variation direction of the optical image 22 in the light receiving portion 1031 of the sensor unit 103 at this time.

When the sample 1 fluctuates in the direction S1, the optical image 22 shifts in a direction U1. When the sample 1 fluctuates in the direction S2, the optical image 22 shifts in a direction U2. Further, when the sample 1 fluctuates in height in the normal direction n, the optical image 22 is shifted in the direction m.

The sample 1 illustrated in FIG. 9C ideally has no height variation in the normal direction n. When the height of the sample 1 illustrated in FIG. 9C varies in the normal direction n, the optical image 22 shifts in the direction m. That is, due to the variation in the height of the sample 1, the position of the optical image 22 is shifted in proportion to cos(a) in the longitudinal direction δ of FIG. 9A, and is shifted in proportion to sin(a) in the lateral direction γ.

When the optical image 22 is shifted in the lateral direction γ, the optical image deviates from the light receiving portion 1031 of the sensor unit 103, so that the quantity of light decreases. When the optical image 22 is shifted in the longitudinal direction δ, the imaging position of the sample 1 in the longitudinal direction changes. In the present embodiment, the light receiving portion 1031 of the sensor unit 103 is a two-dimensional sensor in which predetermined imaging elements are arranged in both the longitudinal direction δ and the lateral direction γ. The control unit 53 measures the deviation of the optical image 22 in the lateral direction γ by the light receiving portion 1031, which is a two-dimensional sensor, and measures the variation in the height of the sample 1. Then, the control unit 53 physically shifts the sensor unit 103 by sensor shift units 104-V and 104-H on the basis of the variation in the height of the sample 1, and suppresses the shift of the optical image 22 due to the height variation. As the sensor shift units 104-V and 104-H, an ultrasonic linear actuator may be applied.

FIG. 9C is a block diagram of the light condensing detection unit 102 that detects the image of the illumination spot from the direction orthogonal to the longitudinal direction of the illumination spot 20 as viewed from the light receiving portion and the direction of the sensor unit 103.

FIG. 9C corresponds to the condensing detection unit 102-3. The sensor unit 103 is disposed such that the light flux center incident from the imaging lens 1027 is orthogonal to the arrangement direction of the pixels of the sensor unit 103.

Figure 10:
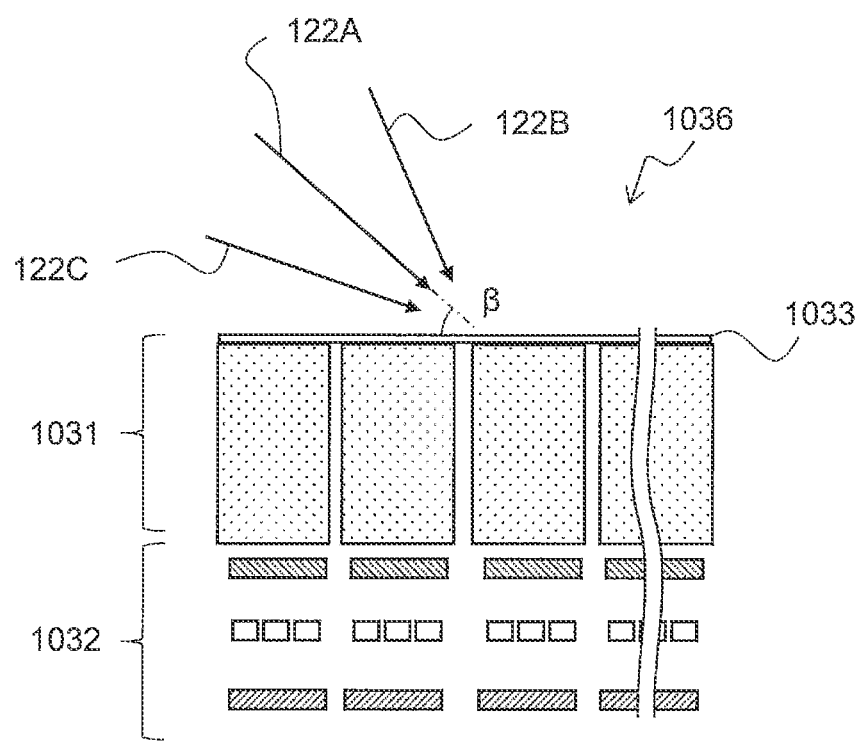
FIG. 10 is a cross-sectional block diagram of a sensor unit.

FIG. 10 illustrates a cross-sectional configuration diagram of an imaging sensor 1036 constituting the sensor unit 103.

The imaging sensor 1036 is configured by stacking an antireflection film 1033, a light receiving portion 1031, and a wiring portion 1032 in order from the surface. The incident lights 122A to 122C are lights incident on the imaging sensor 1036.

The incident light 122A is light on the optical axis 121 illustrated in FIGS. 9A and 9B. The incident lights 122B and 122C are lights incident from an angle different from the optical axis 121.

The antireflection film 1033 is a film for preventing surface reflection of each of the incident lights 122A to 122C. The light receiving portion 1031 has an array shape, and performs photoelectric conversion for each divided region, that is, each pixel. The wiring portion 1032 independently extracts electricity output from the light receiving portion 1031 to the outside.

As described above, a sensor having a structure in which the light receiving portion 1031 is on the light incident side of the wiring portion 1032 is known as a back side illumination sensor.

In the present embodiment, the incident light is incident while being shifted from the normal direction of the light receiving portion by a predetermined angle. Therefore, in a CMOS imaging sensor known as FSI (Front side Illumination) and having a structure in which a wiring portion is on a light incident side, light is absorbed by the wiring portion, and sufficient light cannot be made incident on a light receiving portion.

As illustrated in incident lights 122A to 122C, light beams are incident on the light receiving portion 1031 from various directions. Therefore, the antireflection film 1033 cannot obtain good sensitivity to the incident lights 122A to 122C unless it has a high absorption rate.

In general, an antireflection film of an imaging sensor is formed on the assumption that an incident angle of light is close to 0 degrees. This will be described with reference to FIG. 11.

FIG. 11 is a graph illustrating an absorption rate at which light is absorbed by the light receiving portion 1031 formed of Si in a case where the antireflection film 1033 is formed of four thin films of SiN of 27 nm, $SiO_2$ of 44 nm, SiN of 30 nm, and $SiO_2$ of 80 nm from the light incident side, and light having a wavelength of 266 nm is incident. The horizontal axis of the graph represents the incident angle, and the vertical axis of the graph represents the absorption rate.

A curve 10331 indicates the characteristic of the absorption rate of the S-polarized light. A curve 10332 indicates the characteristic of the absorption rate of the P-polarized light.

When the incident angle of the light is 0 degrees, that is, when the light is incident from the normal direction, the absorption rate is high. However, as the incident angle of light increases, the absorption rate decreases. Specifically, when the incident angle of light is around 25 degrees, the absorption rate of the S-polarized light decreases to 0.5, and when the incident angle is around 33 degrees, the absorption rate of P-polarized light decreases to 0.5. When the incident angle is around 45 degrees, the absorption rate of the S-polarized light is 0.1 and the absorption rate of the P-polarized light is 0.3, which are significantly decreased.

As described above, it can be seen that even if a general antireflection film is formed on the light receiving portion, good sensitivity cannot be obtained due to the incident angle of light.

FIG. 12A is a graph illustrating characteristics of the antireflection film 1033 formed of one layer of $HfO_2$ of 25 nm. The horizontal axis of the graph represents the incident angle, and the vertical axis of the graph represents the absorption rate.

A curve 10333 is a characteristic of the absorption rate of the S-polarized light. A curve 10334 is a characteristic of the absorption rate of the P-polarized light. The absorption rate of the P-polarized light decreases as the incident angle increases, but the absorption rate decreases to 0.5 around the incident angle of 60 degrees.

In addition, the S-polarized light has increased to an incident angle of about 70 degrees, and exhibits an absorption rate of 70% or more in a region where the incident angle is 0 to 80 degrees. However, the sensor units 103-1 and 103-2 need to be inclined by a predetermined angle in order to realize imaging detection without defocusing regardless of a change in the visual field of the operation distance.

That is, the normal line of the light receiving surface of the sensor unit 103-1 is desirably inclined by, for example, 10 to 80 degrees from an optical axis 121-1 of the condensing detection unit 102-1.

In order to maximize the performance of the antireflection film 1033 of the present embodiment, the rotation angle of the ½ wavelength plate 1024 in FIG. 9A is preferably controlled so that the S-polarized light enters the sensor unit 103. In addition, by increasing the magnification of the expander formed by the pair of cylindrical lenses 1025 and 1026 in FIG. 9B, substantially linear polarization incidence can be realized.

In the present embodiment, $HfO_2$ is used as the antireflection film 1033, but $Si_3N_4$ is used as a substance having a similar refractive index to incident light having a wavelength of 266 nm. The refractive index of $HfO_2$ for incident light having a wavelength of 266 nm is (2.1, 0). On the other hand, the refractive index of $Si_3N_4$ with respect to incident light having a wavelength of 266 nm is (2.21, 0.0013).

Since the extinction coefficient of Si, which is a light receiving surface, is large, the antireflection film 1033 easily obtains good absorption rate characteristics with a large refractive index. $Si_3N_4$ has a larger refractive index than $HfO_2$, but has a problem that the extinction coefficient is not 0. The absorption rate characteristic of $Si_3N_4$ is substantially similar to that of $HfO_2$.

The antireflection film 1033 desirably has a thickness of 22 nm to 29 nm for both $Si_3N_4$ and $HfO_2$. As an example, at a wavelength of 266 nm, the absorption characteristics of $HfO_2$ with film thicknesses of 21 nm and 30 nm to the silicon surface are shown.

Modification of First Embodiment

FIG. 12B is a graph illustrating characteristics of the antireflection film 1033 formed of one layer of $HfO_2$ of 21 nm. The horizontal axis of the graph represents the incident angle, and the vertical axis of the graph represents the absorption rate.

A curve 10339 is an absorption rate characteristic of incident S-polarized light. A curve 10330 is an absorption rate characteristic of incidence of P-polarized light. At the film thickness of 21 nm, the curves 10339 and 10330 are flat when the incident angle is from 0 degrees to around 45 degrees, but the absorption rate decreases at more incident angles.

FIG. 12C is a graph illustrating characteristics of the antireflection film 1033 formed of one layer of $HfO_2$ of 30 nm. The horizontal axis of the graph represents the incident angle, and the vertical axis of the graph represents the absorption rate.

A curve 10339a is an absorption rate characteristic of incident S-polarized light. A curve 10330a is an absorption rate characteristic of incidence of P-polarized light. As indicated by the curve 10339a, when the antireflection film 1033 has a film thickness of 30 nm, the absorption rate of P-polarized light incidence increases when the incident angle is around 75 degrees, but the absorption rate of P-polarized light incidence decreases in a region where the incident angle is 45 degrees or less.

In the present embodiment, the characteristics with respect to the incident light of 266 nm are shown, but the wavelength of the incident light may have a predetermined deviation such as 240 nm to 293 nm. In addition, $HfO_2$ has a large refractive index but a relatively small extinction coefficient up to a wavelength around 190 nm. Therefore, the antireflection film 1033 using $HfO_2$ can realize good sensor sensitivity in a wavelength region of 190 to 266 nm.

Second Embodiment

Figure 12D:
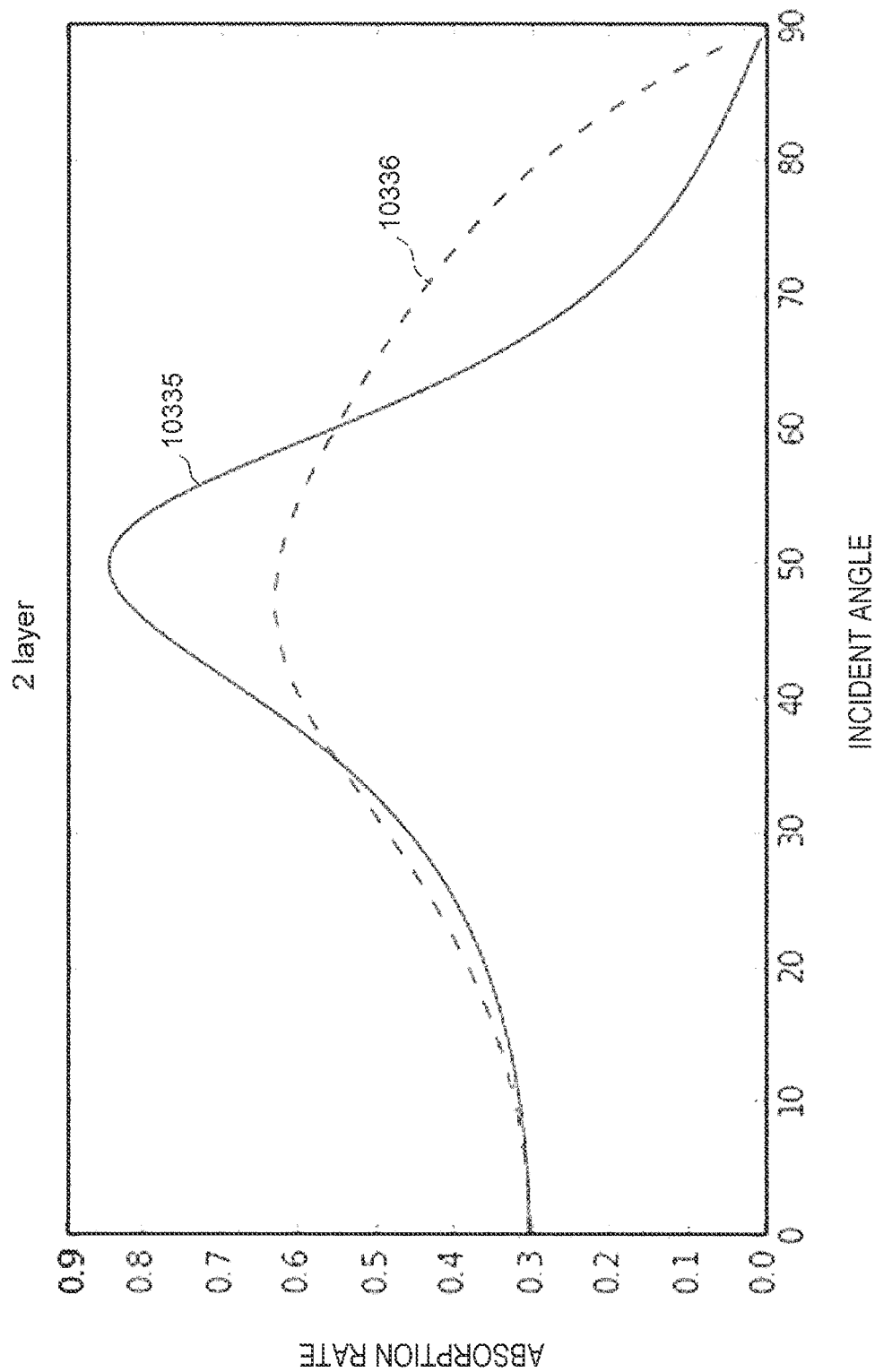
FIG. 12D is a graph illustrating a light absorption rate of a silicon substrate in a case where an antireflection film according to a second embodiment of the present invention is formed on the silicon substrate.

FIG. 12D is a graph illustrating characteristics of the antireflection film 1033 formed of two layers of SiN of 36.8 nm and $SiO_2$ of 90 nm. The horizontal axis of the graph represents the incident angle, and the vertical axis of the graph represents the absorption rate.

A curve 10335 indicates an absorption rate characteristic of the S-polarized light. A curve 10336 indicates an absorption rate characteristic of P-polarized light. In a case where the incident angle of the incident light 122A is 50 degrees, the absorption rate indicated by the curve 10335 at 50 degrees is better than the curve 10333 illustrated in FIG. 12A. That is, the normal line of the light receiving surface of the sensor unit 103-1 is desirably inclined by, for example, 45 to 55 degrees from the optical axis 121-1 of the condensing detection unit 102-1.

However, the region having a good absorption rate is a section having an incident angle of about 45 to 55 degrees and a width of about 10 degrees, and it cannot be said that the region has good characteristics when the numerical aperture of the condensing lens 1021 is large.

Third Embodiment

Figure 12E:
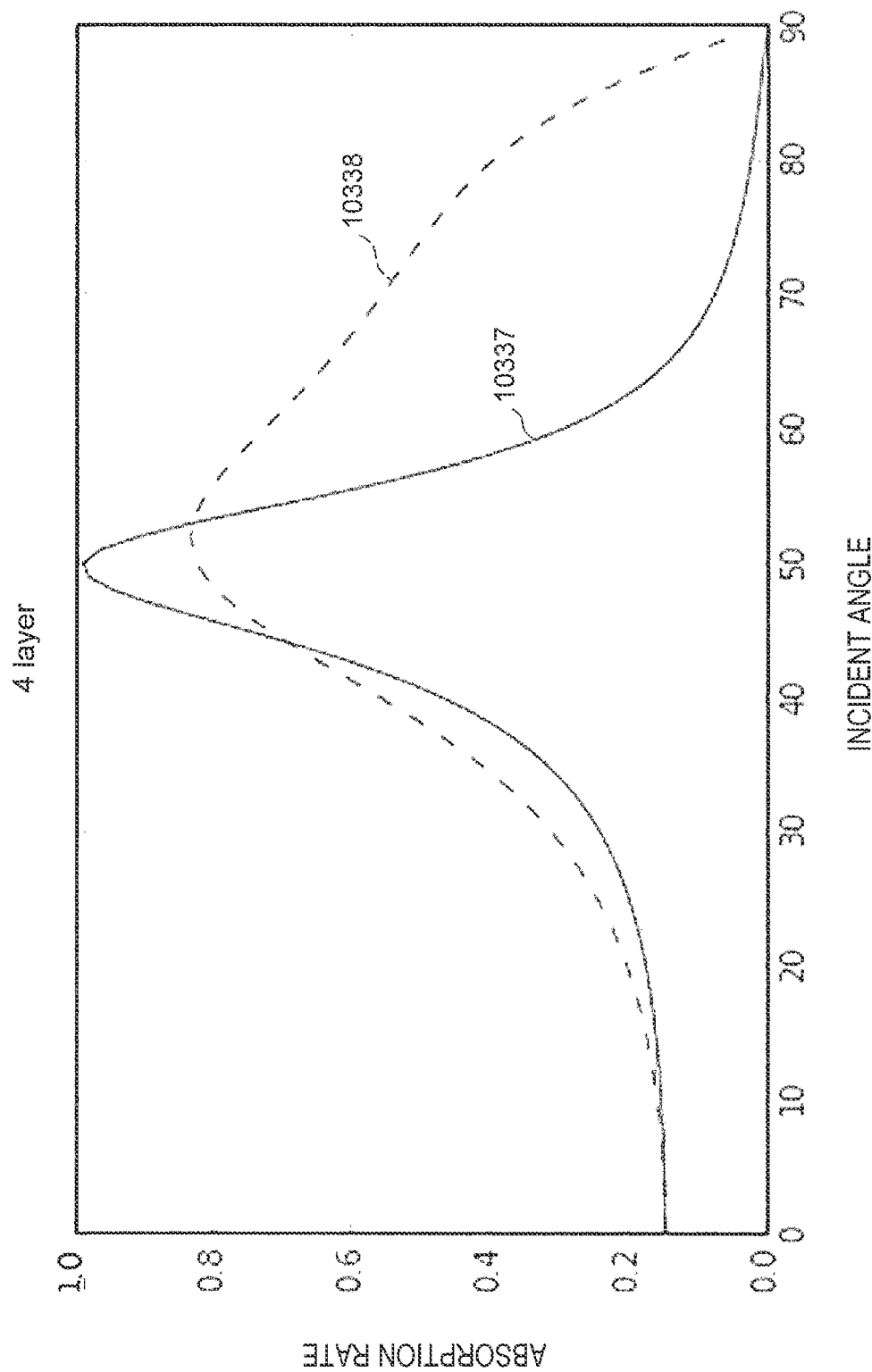
FIG. 12E is a graph illustrating a light absorption rate of a silicon substrate in a case where an antireflection film according to a third embodiment of the present invention is formed on the silicon substrate.

FIG. 12E is a graph illustrating characteristics of the antireflection film 1033 formed of SiN of 36.8 nm, $SiO_2$ of 46 nm, SiN of 33.5 nm, and $SiO_2$ of 94 nm. The horizontal axis of the graph represents the incident angle, and the vertical axis of the graph represents the absorption rate.

The absorption rate characteristic of the S-polarized light shown by the curve 10337 is very good at an incident angle of 50 degrees, but the incident angle range in which the absorption rate is good is narrower than the state of the two layers illustrated in FIG. 12D, and the absorption rate of the P-polarized light shown by the curve 10338 is inferior to the S-polarized light at its peak position. In this case, the normal line of the light receiving surface of the sensor unit 103-1 is desirably inclined by, for example, 45 to 55 degrees from the optical axis 121-1 of the condensing detection unit 102-1.

Both of the characteristics of the antireflection film 1033 illustrated in FIGS. 12D and 12E are such that the thickness of the SiN film on the light incident side is about 37 nm, which is thicker than the thickness of the SiN film of 27 nm illustrated in FIG. 11. As a result, in the present embodiment, the reflection of the SiN film on the large incident film and the reflection from the light receiving portion formed of Si are interfered to suppress the reflection, and the absorption rate is improved.

As shown from the above comparison, under the conditions of the present invention, that is, in a case where the optical axis 121 incident on the sensor unit 103 deviates from the normal direction of the light receiving portion and the angle of the incident light flux varies, the antireflection film 1033 is desirably formed of one layer.

The peak characteristics of the two-layer curve 10335 and the peak characteristics of the four-layer curves 10336 and 10337 are better than the characteristics of the curve 10333. In order to take advantage of this favorable absorption rate characteristic, light incident on the sensor unit 103 may be collimated.

Fourth Embodiment

Figure 13:
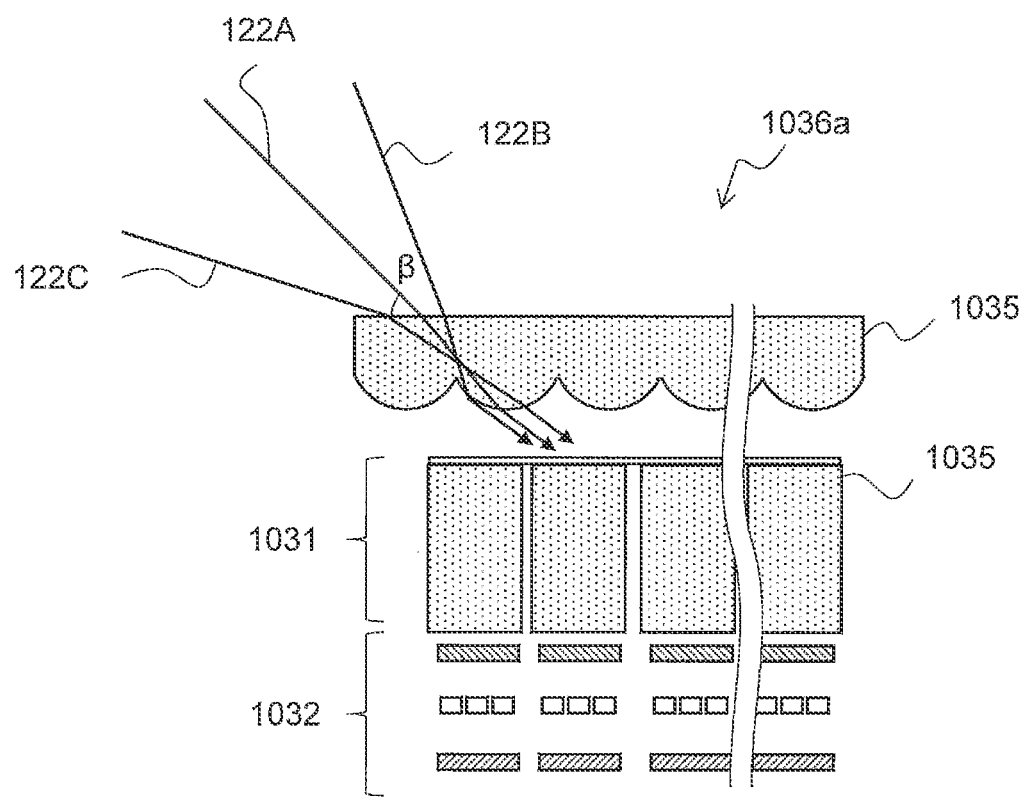
FIG. 13 is a block diagram of an imaging sensor including a cylindrical lens array disposed on a sensor unit incident side according to a fourth embodiment of the present invention.

FIG. 13 is a view illustrating an imaging sensor 1036a that collimates incident light.

The imaging sensor 1036a is configured by stacking a cylindrical lens array 1035, an antireflection film 1033, a light receiving portion 1031, and a wiring portion 1032 in order from the surface. Among them, the antireflection film 1033, the light receiving portion 1031, and the wiring portion 1032 are similar to the imaging sensor 1036 illustrated in FIG. 10.

The cylindrical lens array 1035 is an array of cylindrical lenses formed of synthetic quartz. The lens pitch of the cylindrical lens array 1035 is formed to be equal to the pitch of the light receiving portion 1031.

The cylindrical lens array 1035 is disposed such that a light flux emitted from the imaging lens 1027 (FIGS. 9A to 9C) forms an image in the cylindrical lens array 1035, and light emitted from the cylindrical lens array 1035 is collimated. The pitch of the cylindrical lens array 1035 and the light receiving portion 1031 is shifted such that the light collimated by each cylindrical lens is incident on each pixel of the light receiving portion 1031.

By using such an imaging sensor 1036a, the antireflection film 1033 can include two or four layers.

Figure 14:
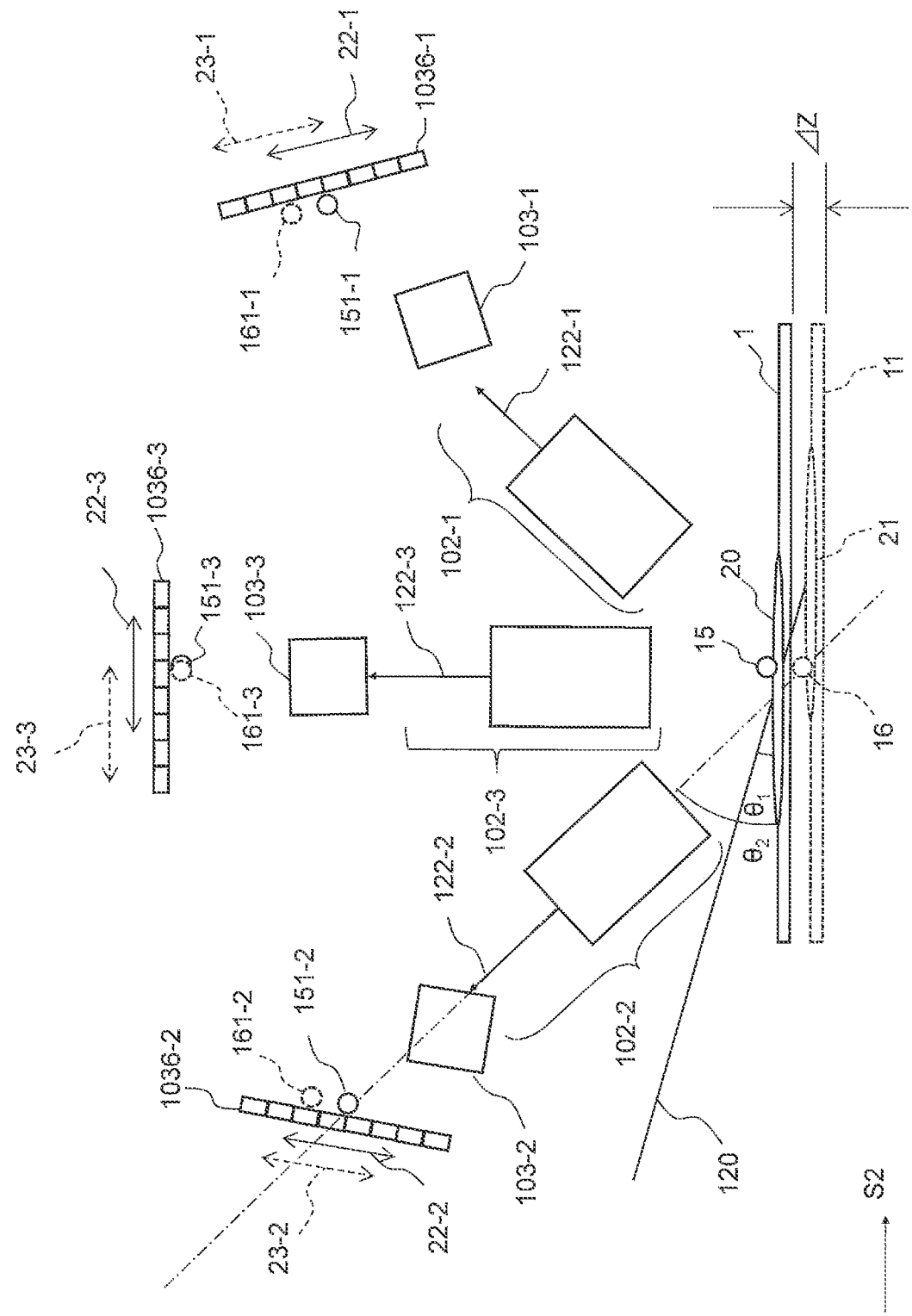
FIG. 14 is a block diagram of a detection optical system for explaining positional displacement on a sensor surface due to displacement of a sample in a Z direction according to the first embodiment of the present invention.

The shift of the optical image in the sensor unit 103 when the sample 1 is shifted by ΔZ in the configuration of FIG. 1 will be described with reference to FIG. 14.

An imaging sensor 1036-1 is included in the sensor unit 103-1. An imaging sensor 1036-2 is included in the sensor unit 103-2. An imaging sensor 1036-3 is included in the sensor unit 103-3.

In the sample 1, the illumination spot 20 is illuminated by irradiation with a laser light beam. A defect 15 is formed on the surface of the sample 1.

At this time, an optical image 22-1 of the illumination spot 20 and an optical image 151-1 of the defect 15 are formed on the surface of the imaging sensor 1036-1. On the surface of the imaging sensor 1036-2, an optical image 22-2 of the illumination spot 20 and an optical image 151-2 of the defect 15 are formed. On the surface of the imaging sensor 1036-3, the optical image 22-3 of the illumination spot 20 and an optical image 151-3 of the defect 15 are formed.

Here, a sample 11 whose position is shifted by ΔZ with respect to the sample 1 is considered. An illumination spot 21 is a region in which the surface of the sample 11 is illuminated with a predetermined illumination intensity by irradiation with the laser light beam, and the position thereof is shifted by ΔZ with respect to the sample 1. A defect 16 is obtained by shifting the defect 15 of the sample 1 by ΔZ.

When this is imaged, an optical image 23-1 of the illumination spot 21 and an optical image 161-1 of the defect 16 are formed on the surface of the imaging sensor 1036-1. On the surface of imaging sensor 1036-2, an optical image 23-2 of the illumination spot 21 and an optical image 161-2 of the defect 16 are formed. On the surface of the imaging sensor 1036-3, an optical image 23-3 of the illumination spot 21 and an optical image 161-3 of the defect 16 are formed.

Here, the optical axis 121-1 of the condensing detection unit 102-1 and an optical axis 122-2 of the condensing detection unit 102-2 are line-symmetric with respect to the normal line of the sample 1. In addition, an optical axis 122-3 of the condensing detection unit 102-3 coincides with the normal direction of the surface of the sample 1.

Assuming that the incident angle of the optical axis 120 of the illumination light is $\theta_1$, the illumination spot 20 is shifted to the position of the illumination spot 21 by shifting the sample 1 by ΔZ. At this time, a shift amount Δspot of the position of the optical image 22 of the illumination spot 20 with respect to the optical image 23 of the illumination spot 21 is expressed by the following Expression (6).

[Math. 6]

$$\Delta spot = \Delta Z/\tan \theta_1 + \varepsilon \qquad (6)$$

Here, ε is a shift of the illumination spot 21.

Assuming that the elevation angle of the condensing detection unit 102-2 is $\theta_2$, in the imaging sensor 1036-2, a shift amount ΔS2_2 of the defect 16 from the optical image 161-1 to the optical image 151-1 of the defect 15 due to the deviation of the surface of the sample 1 by ΔZ is expressed by the following Expression (7).

[Math. 7]

$$\Delta S2\_2 = -\Delta Z/\tan \theta_2 \qquad (7)$$

A shift amount ΔS2_1 between the optical image 161-1 of the defect 16 and the optical image 151-1 of the defect 15 formed in the imaging sensor 1036-1 is inverted in positive and negative from ΔS2_2.

A shift amount Δspot2 of the optical image 23-2 of the illumination spot 21 from the optical image 22-2 of the illumination spot 20 in the imaging sensor 1036-2 is expressed by the following Expression (8).

[Math. 8]

$$\Delta spot2 = -\Delta Z/\tan \theta_2 + \Delta Z/\tan \theta_1 + \varepsilon \qquad (8)$$

A shift amount Δspot1 of the illumination spot 21 of the optical image 23-1 from the optical image 22-1 of the illumination spot 20 in the imaging sensor 1036-1 is expressed by the following Expression (9).

[Math. 9]

$$\Delta spot1 = \Delta Z/\tan \theta_2 + \Delta Z/\tan \theta_1 + \varepsilon \qquad (9)$$

When Δspot2 is subtracted from Δspot1, the positional deviation of the illumination spot 21 can be canceled.

[Math. 10]

$$\Delta spot1 - \Delta spot2 = 2\Delta Z/\tan \theta_2 \qquad (10)$$

Δspot1 and Δspot2 are calculated from the centroid positions of the haze light quantities of the imaging sensor 1036-1 and the imaging sensor 1036-2, 2ΔZ/tan $\theta_2$ is obtained, and ΔS2_2 is obtained from Expression (7), whereby the shift amount of the optical image of the defect 15 on the sensor surface can be obtained.

In the present embodiment, since the one-dimensional sensor is used for the sensor units 103-1 and 103-2, the positional deviation of the illumination spot 21 in the direction S1 cannot be measured. Therefore, the positional deviation of the illumination spot 21 in the direction S1 may be measured by the two-dimensional sensor 93 or the sensor unit 103-4.

Figure 15:
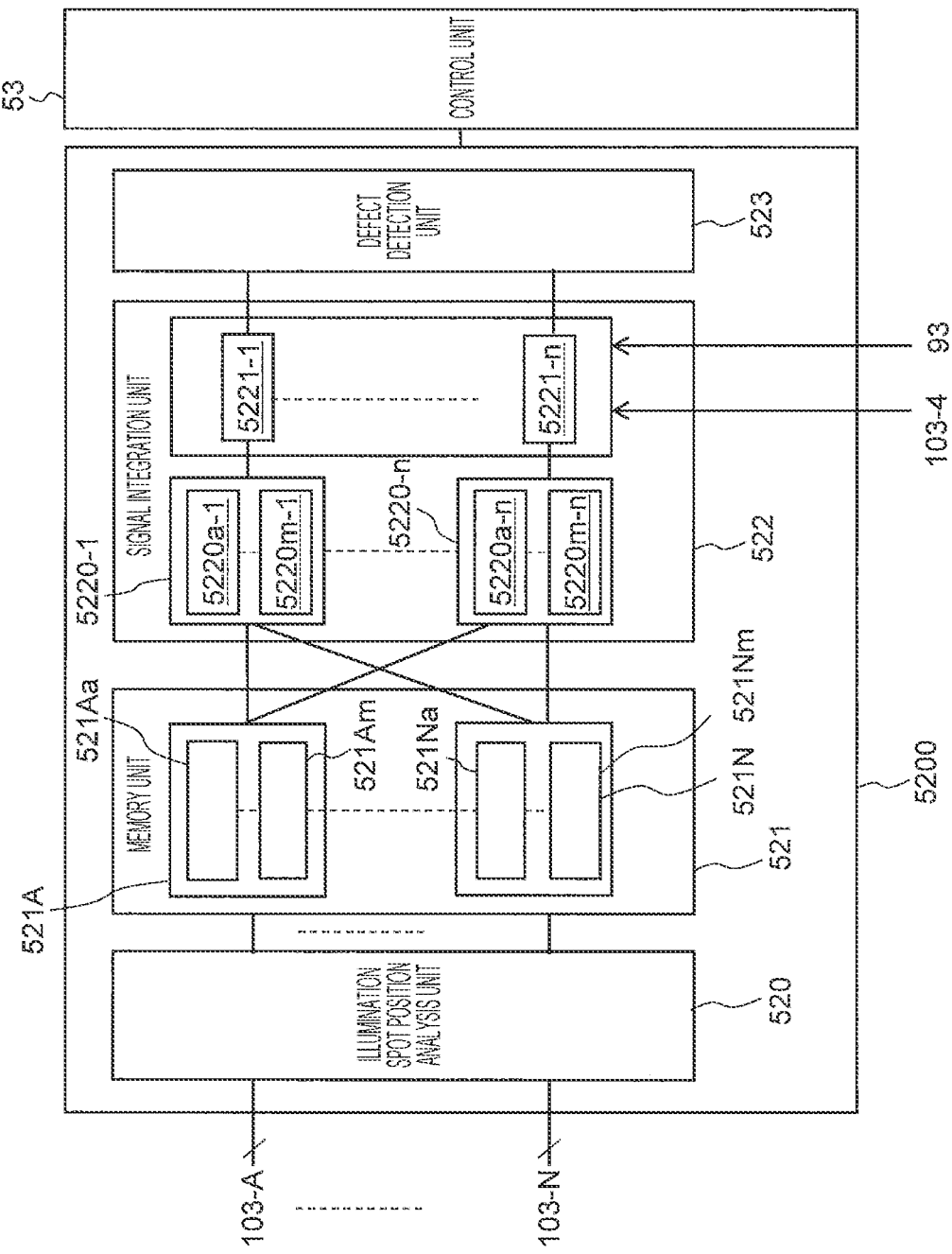
FIG. 15 is a block diagram illustrating a schematic configuration of a signal processing unit.

FIG. 15 is a block diagram of data processing processed by the signal processing unit 5200 and an operation thereof.

Each of the sensors 103-A to 103-N transfers data for m pixels to the signal processing unit 5200.

The illumination spot position analysis unit 520 calculates the shift amount ΔZ by Expression (10), and then applies a bandpass filter in the time direction, that is, the direction S1 to extract the defect signal. The illumination spot position analysis unit 520 accumulates the extracted data in the memory unit 521.

Blocks 521A to 521N correspond to the sensors 103-A to 103-N, respectively. Blocks 521Aa to 521Am indicate data of spiral scanning from a to m turns of the sensor 103-A. Blocks 521Na to 521Nm indicate data of spiral scanning from a to m turns of the sensor 103-N.

The signal integration unit 522 includes inter-sensor integration units 5220-1 to 5220-n. The inter-sensor integration units 5220-1 to 5220-n combine signals of a linear sum obtained by multiplying the respective signals of the sensors A to N accumulated in the memory unit 521 by a predetermined gain.

As shown in Expression (7), the detected defect causes a positional shift in different directions S2 in each sensor unit 103 due to a height variation of the sample surface. Therefore, in the present embodiment, data is read from the memory so as to combine data indicating the same position on the sample surface in consideration of the positional deviation.

Scanning data 5220a-1 to 5220m-1 of a to m turns are synthesized using a predetermined gain set $G_1$. Scanning data 5220an to 5220m-n of a to m turns are synthesized using a predetermined gain set $G_n$.

The light quantity arithmetic units 5221-1 to 5221-n combine scan data from a to m turns obtained by scanning the same place a plurality of times to calculate the light quantity of the defect candidate. Here, in each scan, if the illumination spot 20 is not stable in the direction S1, the quantity of light at the same position cannot be added. Therefore, the shift amount in the direction S1 is measured and corrected by the sensor unit 103-4 or the two-dimensional sensor 93, and data obtained by different scanning is corrected.

The defect detection unit 523 determines a defect when any of the quantities of the defect candidates calculated by the light quantity arithmetic units 5221-1 to 5221-n exceeds the threshold value set for each gain set, and outputs information on the quantity of defect light and the position where the defect is detected to the control unit 53 illustrated in FIG. 1. The control unit 53 causes the display unit 54 or the like to display information on the quantity of defect light and the position where the defect is detected.

Fifth Embodiment

In order to improve the defect detection sensitivity, it is important to improve the resolution of an image to be captured. In order to improve the resolution in the direction S1 in the first embodiment, the width of the illumination spot 20 may be narrowed. However, when the width of the illumination spot 20 is narrowed, the power density of the light with which the sample 1 is irradiated is increased, and the sample 1 is damaged. Therefore, in the fifth embodiment, the sensitivity is improved using a sensor that performs integral exposure in the width direction of the optical image 22. In the fifth embodiment, light beams passing through both optical paths branched by the polarization beam splitter 1023 are detected and added.

Figure 16A:
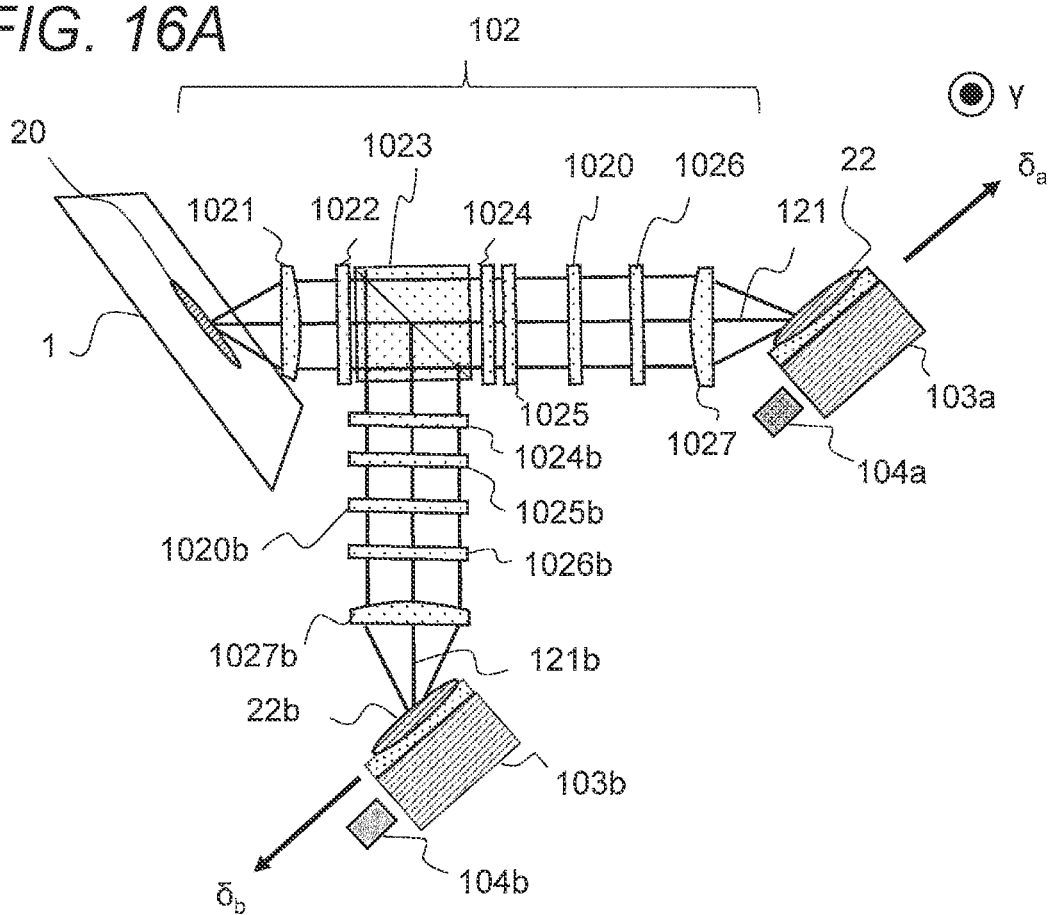
FIG. 16A is a block diagram of a configuration of a detection optical system as viewed from a cross section in an illumination longitudinal direction of linear illumination.
Figure 16B:
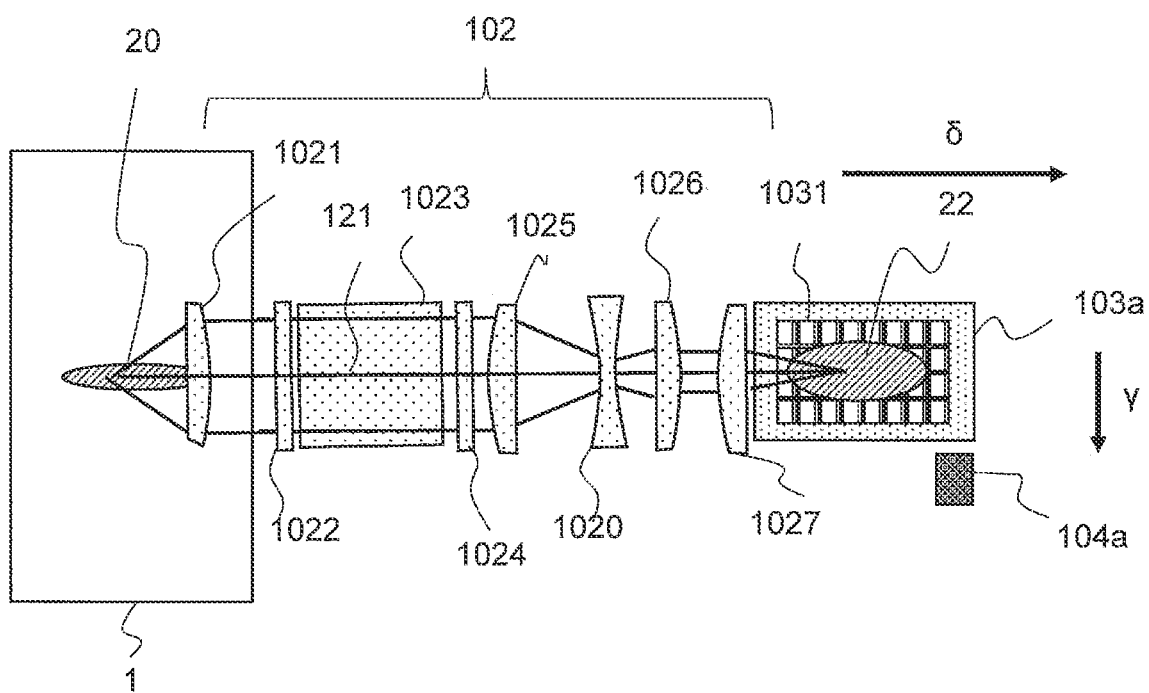
FIG. 16B is a block diagram of a configuration of a detection optical system as viewed from a cross section in an illumination longitudinal direction of linear illumination.

FIG. 16A is a diagram viewed in the arrangement direction of the light receiving portion 1031 of the sensor unit 103 of FIG. 1 and viewed from the +Y direction of FIG. 1. FIG. 16B is a diagram viewed in the direction orthogonal to the arrangement direction of the light receiving portion 1031 of the sensor unit 103 of FIG. 1 and the −Z direction of FIG. 1.

The condensing detection unit 102 condenses the reflected light of the illumination spot from the surface of the sample 1 and controls the polarization state of the incident light to form an optical image. The condensing detection unit 102 includes a condensing lens 1021, a ½ wavelength plate 1022, a polarization beam splitter 1023, a ½ wavelength plate 1024, cylindrical lenses 1025, 1020, and 1026, and an imaging lens 1027 in the direction of the optical axis 121. The light condensing detection unit 102 further includes a ½ wavelength plate 1024b, cylindrical lenses 1025b, 1020b, and 1026b, and an imaging lens 1027b in the direction of the light separated by the polarization beam splitter 1023. Here, a difference from the condensing detection unit 102 illustrated in FIGS. 9A and 9B will be described.

The condensing detection unit 102 condenses light by the condensing lens 1021 and controls a polarization direction thereof by the ½ wavelength plate 1022. The ½ wavelength plate 1022 is rotatable by a drive unit (not illustrated). The polarization beam splitter 1023 splits the optical path by polarization. Hereinafter, similarly to the first embodiment, the ½ wavelength plate 1024, the cylindrical lenses 1025, 1020, and 1026, the imaging lens 1027, and a sensor unit 103a are disposed in one optical path into which the polarization beam splitter 1023 is branched. Typically, the polarization direction of this optical path is S-polarized light.

The cylindrical lenses 1025, 1020, and 1026 form a cylindrical zoom optical system. Each of the cylindrical lenses 1020 and 1026 is movable along the optical axis 121 by a drive system (not illustrated), and controls the magnification in the direction γ of the sensor unit 103a. The longitudinal direction of the sensor unit 103a is a direction $δ_a$. A sensor shift unit 104a physically shifts the sensor unit 103a to suppress the shift of an optical image 22a due to the height variation. The sensor unit 103a is a first sensor unit that outputs an optical image of an illumination spot by the condensing detection unit 102 as an electrical signal, and includes an array-shaped light receiving portion and an antireflection film at a position conjugate with the illumination spot with which the surface of the sample 1 is irradiated.

The ½ wavelength plate 1024 controls the polarization direction such that the absorption efficiency in the light receiving portion 1031 of the sensor unit 103a disposed at the subsequent stage increases. The ½ wavelength plate 1024 functions as a first polarization direction conversion unit that converts a polarization direction of light and guides the light to the sensor unit 103a (first sensor unit).

Therefore, the ½ wavelength plate is not inserted into the optical path on the S-polarization output side of the polarization beam splitter 1023. The ½ wavelength plate can be changed by setting the film thickness of the antireflection film of the light receiving portion of the sensor unit 103, and the wavelength plate may be inserted into both of the two optical paths.

The ½ wavelength plate 1024b, the cylindrical lenses 1025b, 1020b, and 1026b, the imaging lens 1027b, and a sensor unit 103b are disposed in the other optical path branched by the polarization beam splitter 1023. Typically, the polarization direction of the other optical path is P-polarized light. The sensor unit 103b is a second sensor unit that outputs an optical image of the illumination spot by the condensing detection unit 102 as an electrical signal, and includes an array-shaped light receiving portion and an antireflection film at a position conjugate with the illumination spot with which the surface of the sample 1 is irradiated.

The ½ wavelength plate 1024b controls the polarization direction such that the absorption efficiency in the light receiving portion 1031 of the sensor unit 103b disposed at the subsequent stage increases. The ½ wavelength plate 1024b functions as a second polarization direction conversion unit that converts the polarization direction of light and guides the light to the sensor unit 103b (second sensor unit). As described above, in the present embodiment, both the P-polarized light and the S-polarized light are branched into two optical paths, and the polarization directions are controlled such that the absorption efficiency in the light receiving portion is high, so that the sensitivity of the sensor unit can be improved.

The cylindrical lenses 1025b, 1020b, and 1026b form a cylindrical zoom optical system. Each of the cylindrical lenses 1020b and 1026b is movable along an optical axis 121b by a drive system (not illustrated), and controls the magnification in the direction γ of the sensor unit 103b. The longitudinal direction of the sensor unit 103b is a direction $δ_b$. A sensor shift unit 104b physically shifts the sensor unit 103b to suppress the shift of an optical image 22b due to the height variation.

The imaging lenses 1027 and 1027b form the illumination spot 20 as the optical images 22 and 22b of the sensor units 103a and 103b, respectively. The sensor units 103a and 103b are formed such that pixels are arranged in a two-dimensional array. The sensor units 103a and 103b are, for example, time delay integration (TDI) sensors. The TDI sensor is a type of CCD sensor, and performs integral exposure at the timing of vertically transferring electric charges in units of columns in accordance with the timing at which the optical image 22 moves in the vertical direction. As a result, integral exposure for the number of vertical stages of CCD pixels can be performed, and sensitivity is improved and variation in sensitivity is improved.

Figure 17:
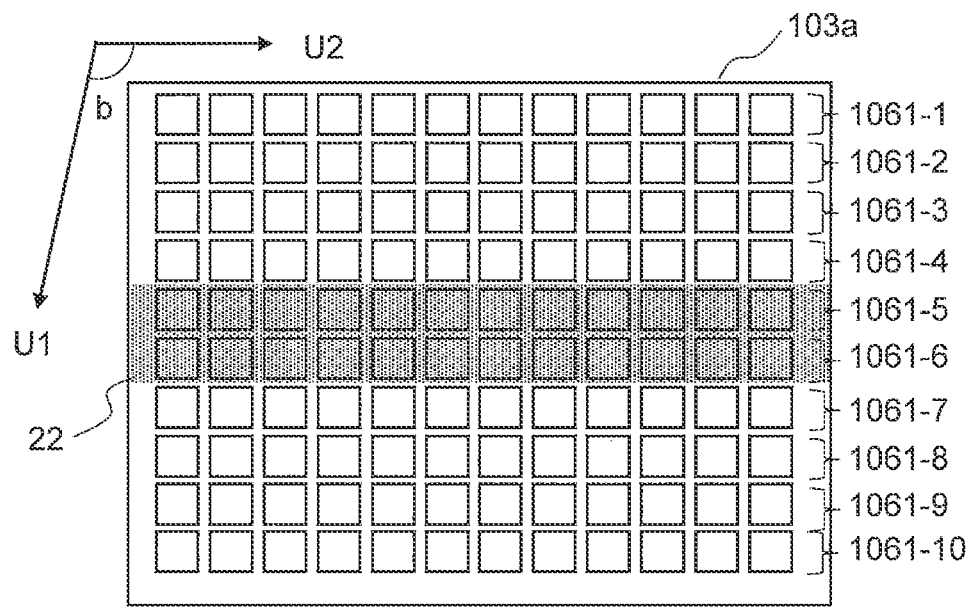
FIG. 17 is a view illustrating a certain imaging state of the optical image in the sensor unit.

FIG. 17 is a view illustrating the sensor unit 103a and the optical image 22 formed by the condensing detection unit 102 of the illumination spot 20.

The sensor unit 103a is a TDI sensor, and a plurality of CCD pixels are arranged in a lattice pattern. The sensor unit 103a includes lines 1061-1 to 1061-10 configured by rows of a plurality of CCD pixels. The sensor unit 103a scans the line 1061-1 to the line 1061-10 sequentially at a predetermined rate at the time of imaging, and integrates the exposure values of the CCD pixels of the respective columns.

In FIG. 17, the horizontal direction is the longitudinal direction and the direction U2 of the sensor unit 103a, and the vertical direction is the charge accumulation direction and the lateral direction of the sensor unit 103a. The direction U2 in the sensor unit 103a is the longitudinal direction and corresponds to the direction S2 on the sample 1. The direction U1 in the sensor unit 103a corresponds to the scanning direction S1 on the sample 1. The angle of the direction U1 changes depending on the magnification of the cylindrical zoom optical system including the cylindrical lenses 1025, 1020, and 1026.

As the magnification of the cylindrical zoom optical system increases, the angle formed by the direction U1 and the direction U2 approaches a right angle. Since the sensor unit 103a, which is a TDI sensor, performs integral exposure in the lateral direction perpendicular to the direction U2, when the direction U1 approaches a right angle with respect to the direction U2, blurring of imaging data of the optical image 22 is reduced, and resolution is improved.

On the other hand, when the scanning speed of the sensor unit 103a, which is a TDI sensor, deviates from the moving speed of the optical image 22, blurring occurs in the imaging data. In a case where the moving speed of the optical image 22 is high and high-speed scanning is required for the sensor unit 103a, it is preferable to reduce the magnification of the cylindrical zoom optical system and reduce the moving speed of the optical image 22. In the configuration of the present invention, when the magnification in the direction $\delta_1$ (longitudinal direction) of the cylindrical zoom optical system is changed, defocusing occurs in a case where the angle between the optical axis 121 and the normal line of the sensor unit 103a is constant. Therefore, only the magnification in the direction γ (lateral direction) of the cylindrical zoom optical system may be changed.

When the magnification in the direction γ (lateral direction) of the cylindrical zoom optical system is lowered, the angle formed by the direction S1 and the direction S2 deviates from a right angle. At the same time, since the line width of the optical image 23 in the sensor unit 103 of the illumination spot 20 is also narrowed, blurring of the imaging data does not occur.

When the line width of the optical image 23 in the sensor unit 103 of the illumination spot 20 becomes smaller than the pixel size of the sensor unit 103, the number of charge accumulation stages of the TDI is substantially equivalent to 1, and thus blurring of the imaging data due to the insufficient line rate of the TDI does not occur. In this method, since the direction U1 and the direction U2 are not orthogonal to each other, when the line width of the illumination spot 20 increases, a side effect of blurring of imaging data due to integral exposure of the TDI sensor cannot be ignored. In order to suppress this, a line width $spot_w$ of the illumination spot 20 needs to satisfy the following condition.

[Math. 11]

$$spot_w M_{spot} \cos(b) < Th \, P_{s2} M_{S2} \tag{11}$$

Here, $spot_w$: line width of the illumination spot $M_{spot}$: imaging magnification of the illumination spot in the line width direction b: angle formed by direction U1 and direction U2 of the light receiving surface Th: threshold $P_{s2}$: pixel size corresponding to direction S2 of sample surface $M_{S2}$: optical magnification of direction S2

Typically, in the case of imaging from a direction oblique to the direction S2, the width of the illumination spot 20 may be set to be narrower than the size of the sample surface on which each pixel of the sensor 103 images the sample 1.

Sixth Embodiment

In a sixth embodiment, the magnification of the cylindrical zoom optical system is reduced, an angle b formed by the direction U1 and the direction U2 is set to 135 degrees, and integral exposure is performed by shifting by one pixel for each line.

Figure 18:
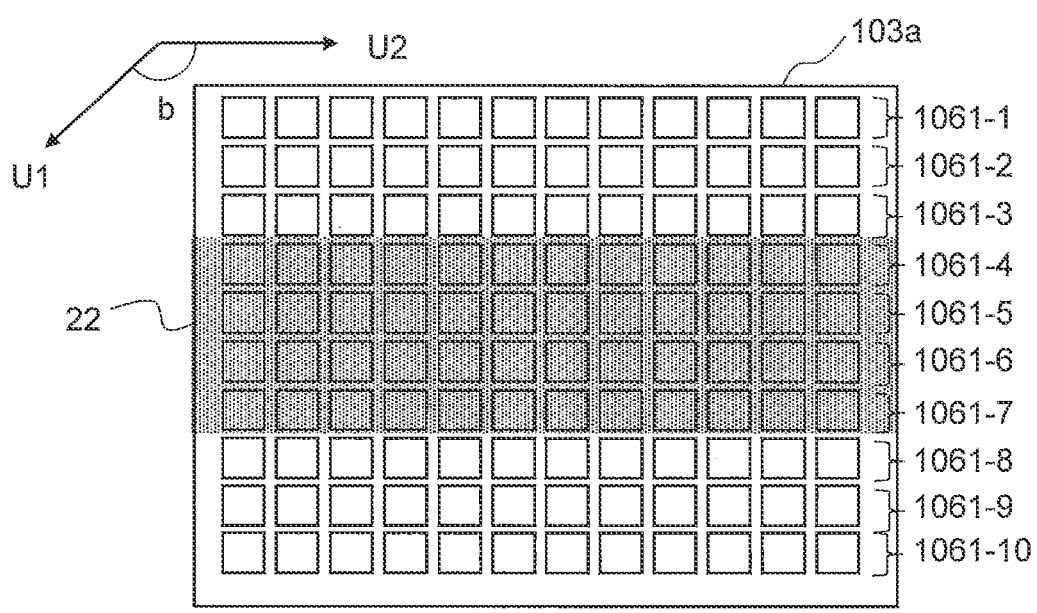
FIG. 18 is a view illustrating another imaging state of the optical image in the sensor unit.
Figure 19:
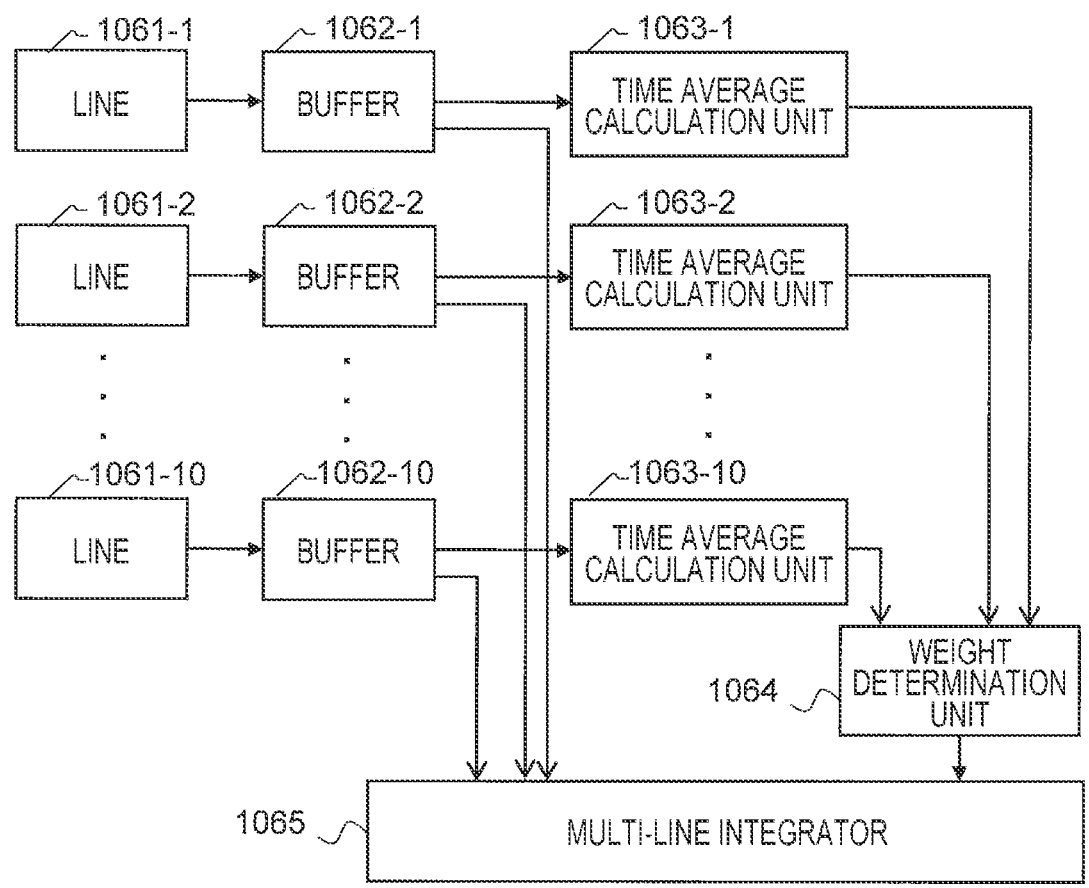
FIG. 19 is a view illustrating a configuration and an operation of an image processing block of a TDI sensor.

FIG. 18 is a view illustrating a case where the angle b formed by the direction U1 and the direction U2 is set to 135 degrees.

The sensor unit 103a is a multi-line linear sensor, and a plurality of pixels is arranged in a lattice shape. The sensor unit 103a includes the lines 1061-1 to 1061-10 configured by rows of a plurality of pixels. The sensor unit 103a scans the line 1061-1 to the line 1061-10 sequentially at a predetermined rate at the time of imaging, and integrates the exposure value of the CCD pixel of each column while shifting the exposure value by one pixel.

When the magnification of the cylindrical zoom optical system is reduced and the line width of the illumination spot 20 is increased, the angle b formed between the direction U1 and the direction U2 on the light receiving surface of the sensor unit 103 deviates from a right angle. Therefore, when integral exposure is performed in the lateral direction of the sensor unit 103, the optical image 22 is shifted in the direction U2 between the lines 1061-1 to 1061-10, and blurring of imaging data occurs.

Therefore, in the sixth embodiment, the magnification of the cylindrical zoom optical system is reduced, and the angle b formed by the direction U1 and the direction U2 is set to 135 degrees. Then, the detected light quantity data detected by each line of the sensor unit 103a is integrated as in the following Expression (12).

[Math. 12]

$$d(x,t) = \Sigma_l \{W(l) \times I(x - l\Delta x, l, t - l\Delta P)\} \tag{12}$$

Here, d(x,t): detected light amount of a sensor x: position in direction U2 t: discrete sampling timing

Δx: displacement to be shifted between lines in direction U2 l: line number of a sensor

ΔP: scanning pitch for each sampling timing of beam spot of sensor surface

The weight W(l) of each line expressed by Expression (12) is calculated by the following Expression (13).

[Math. 13]

$$W(l) = \Sigma_x \frac{\overline{I}(x, l)}{\overline{I}(x, l) + N^2} \quad (13)$$

Here,

W(l): weight of line
x: position in direction U2
t: discrete sampling timing
Δx: displacement to be shifted between lines in direction U2
l: line number of a sensor
ΔP: scanning pitch for each sampling timing of beam spot of sensor surface
N: electric noise of a sensor
$\overline{I}$(x,l): number l, time average of light intensity at line position x FIG. 20 is a block diagram schematically illustrating each unit for calculating this.

The lines 1061-1 to 1061-10 are lines constituting the sensor unit 103. The detected light quantity data of each pixel belonging to the lines 1061-1 to 1061-10 is output to a buffer 1062-1 to a buffer 1062-10 in accordance with the sampling period of the line rate. The buffer 1062-1 to the buffer 1062-10 are memories that temporarily store the detected light quantity data for a predetermined time, and output the detected light amount data for the predetermined time to time average calculation units 1063-1 to 1063-10.

The time average calculation units 1063-1 to 1063-10 calculate a time average of each detected light quantity data for a predetermined time, and output the time average to a weight determination unit 1064.

The weight determination unit 1064 calculates the weight of each line on the basis of Expression (13). A multi-line sensor integrator 1065 integrates the imaging data by adding the light quantity data of each line while shifting the light quantity data by one pixel according to the weight of each line on the basis of Expression (12).

The sensor unit 103 of the present embodiment widens the width of the illumination spot 20 so that the optical image 22 of the illumination spot 20 does not deviate from the light receiving portion 1031 even if the height variation of the sample surface occurs. At this point, only the sensor noise can be detected even if the data of the non-illuminated line is acquired. Therefore, after data is acquired from the multi-line sensor, the detected light quantity data in each line is calculated, and the weight is weakened in a region where the detected light quantity is weak, so that noise is excluded to improve sensitivity.

The weight of each line is not limited to Expression (13), and a setting may be made such that a line having a small sum of the detected light quantities is not detected. This is equivalent to processing of setting the gain of a line having a small detected light quantity to zero.

In the fifth embodiment, the charge transfer between the numbers of accumulation stages of the TDI is transferred one by one, whereas in the sixth embodiment using this multi-line sensor, the movement interval of the illumination beam spot on the sensor surface at each sampling timing is represented by ΔP. Therefore, it is possible to cope with a case where the pitch is larger than the line pitch, and flexible inspection can be realized by changing the pitch. ΔP is set to be small in the high sensitivity inspection, and ΔP is set to be large in the high speed inspection.

As shown in Expression (12), when ΔP corresponding to the high-sensitivity inspection is 1, the outputs between the adjacent lines are added, but when ΔP corresponding to the high-speed inspection exceeds 1, the addition is not performed between the adjacent lines. By this addition, unlike the fifth embodiment, even if there is no cylindrical zoom optical system, it is possible to implement high-throughput inspection in a state where blurring of imaging data is small.

INDUSTRIAL APPLICABILITY

The present invention can be used in an inspection process of inspecting a foreign matter defect attached to a surface of a semiconductor wafer in a manufacturing process of a semiconductor device.

REFERENCE SIGNS LIST

1 sample
2 laser light source
4 emitted light adjustment unit (illumination scanning unit)
5 beam expander
6 polarization control unit
7 condensing optical unit
5200 signal processing unit
53 control unit
54 display unit
55 input unit
91 condensing lens
92 imaging lens
93 two-dimensional sensor
101 illumination unit (illumination optical system)
102-1, 102-2, 102-3 condensing detection unit
103-1, 103-2, 103-3 sensor unit
1031 light receiving portion (light receiving surface)
1032 wiring portion
1033 antireflection film
104-1, 104-2, 104-H, 104-V sensor shift unit
105 stage
1061-1 to 1061-10 line
1062-1 to 1062-10 buffer
1063-1 to 1063-10 time average calculation unit
1064 weight determination unit
1065 multi-line sensor integrator

The invention claimed is:

1. A defect inspection apparatus comprising:
an illumination optical system configured to irradiate a sample surface with a linear illumination spot of light having a wavelength of any one of 240 nm to 293 nm;
an illumination spot scanning unit configured to move the sample surface and scan the linear illumination spot in a lateral direction of the illumination spot;
a light condensing unit configured to condense reflected light of the illumination spot from the sample surface;
a polarization control unit comprising a first wavelength plate that rotates to control a polarization direction of incident light, a polarization beam splitter that splits the light whose polarization direction is determined by the first wavelength plate, and a second wavelength plate that rotates to control a specific polarization direction of the split light emitted from the polarization beam splitter;
an imaging unit configured to form an optical image by the light split by the polarization control unit and having the specific polarization direction; and a sensor unit configured to output the optical image as an electrical signal, the sensor unit including a receiving portion and an antireflection film at a position conjugate with the illumination spot with which the sample surface is irradiated, wherein a first angle, α, formed by an optical axis of the light condensing unit and a longitudinal direction of the linear illumination spot irradiated on the sample is 10 degrees or more and less than 80 degrees, a second angle, β, formed by an arrangement direction of the light receiving portion of the sensor unit and an optical axis of the light condensing unit is 10 degrees or more and less than 80 degrees, the second angle, β, satisfies a condition that an inner product of a vector of the optical axis of the light condensing unit and a pixel arrangement vector of the sensor unit is equal to cos α multiplied by an imaging magnification M, the sensor unit includes a first sensor unit and a second sensor unit, the polarization beam splitter splits light whose polarization direction is controlled by the first wavelength plate to have a polarization component of S-polarized light and a polarization component of P-polarized light, and guides the polarized light to a first optical path and a second optical path, respectively, and the defect inspection apparatus further comprises:

a first polarization direction conversion unit that guides the S-polarized light guided to the first optical path to the first sensor unit; and a second polarization direction conversion unit that converts the P-polarized light guided to the second optical path to a direction of the S-polarized light and guides the converted light to the second sensor unit.

2. The defect inspection apparatus according to claim 1, wherein a condensing detection unit including the light condensing unit, the polarization control unit, and the imaging unit makes an imaging magnification in a lateral direction of the light receiving portion larger than an imaging magnification in a longitudinal direction.

3. The defect inspection apparatus according to claim 1, wherein the antireflection film increases an absorption rate of light incident from an optical axis direction of the light condensing unit to be higher than an absorption rate of light incident from a normal direction of the light receiving portion in light of a wavelength irradiated by the illumination optical system, and light in a polarization direction output from the light condensing unit.

4. A defect inspection apparatus comprising:

an illumination optical system configured to irradiate a sample surface with a linear illumination spot of light having a wavelength of any one of 240 nm to 293 nm;

an illumination spot scanning unit configured to move the sample surface and scan the linear illumination spot in a lateral direction of the illumination spot;

a light condensing unit configured to condense reflected light of the illumination spot from the sample surface;

a polarization control unit comprising a first wavelength plate that rotates to control a polarization direction of incident light, a polarization beam splitter that splits the light whose polarization direction is determined by the first wavelength plate, and a second wavelength plate that rotates to control a specific polarization direction of the split light emitted from the polarization beam splitter;

an imaging unit configured to form an optical image by the light split by the polarization control unit and having the specific polarization direction; and a sensor unit configured to output the optical image as an electrical signal, the sensor unit including a receiving portion and an antireflection film at a position conjugate with the illumination spot with which the sample surface is irradiated, wherein a first angle, α, formed by an optical axis of the light condensing unit and a longitudinal direction of the linear illumination spot irradiated on the sample is 10 degrees or more and less than 80 degrees, a second angle, β, formed by an arrangement direction of the light receiving portion of the sensor unit and an optical axis of the light condensing unit is 10 degrees or more and less than 80 degrees, the second angle, β, satisfies a condition that an inner product of a vector of the optical axis of the light condensing unit and a pixel arrangement vector of the sensor unit is equal to cos α multiplied by an imaging magnification M, the light receiving portion of the sensor unit includes a two-dimensional array-shaped light receiving portion, the defect inspection apparatus further comprises a signal processing unit that performs integrated calculation of a signal acquired from a first line included in an array in a longitudinal direction of the light receiving portion at a first timing and a signal acquired from a second line different from the first line at a second timing, and the illumination spot scanning unit moves the sample in a lateral direction of the illumination spot by a distance on a sample surface imaged by the first line and the second line from the first timing to the second timing.

5. The defect inspection apparatus according to claim 4, wherein the first line and the second line are separated by a predetermined distance, and the illumination spot scanning unit scans the sample such that an optical image of the sample moves by the predetermined distance in a lateral direction between the first timing and the second timing.

6. The defect inspection apparatus according to claim 5, wherein a condensing detection unit including the light condensing unit, the polarization control unit, and the imaging unit sets a magnification in a lateral direction of the illumination spot such that a moving distance on the light receiving portion of the optical image of the sample scanned by the illumination spot scanning unit is equal to the predetermined distance.

7. The defect inspection apparatus according to claim 1, wherein the light receiving portion is disposed on a light incident side with respect to a wiring layer that transmits an output electrical signal of the light receiving portion.

8. The defect inspection apparatus according to claim 1, wherein the antireflection film has a higher absorption rate in the light receiving portion of the light incident from the optical axis direction than an absorption rate in the light receiving portion of the light incident from a normal direction of the light receiving portion in the light of the wavelength irradiated by the illumination optical system.

9. The defect inspection apparatus according to claim 4, wherein the antireflection film is formed of one layer of $HfO_2$ having a film thickness of 21 nm or more and 30 nm or less or one layer of $Si_3N_4$ having a film thickness of 21 nm or more and 30 nm or less.

10. The defect inspection apparatus according to claim 4, wherein a lens array is disposed on a light incident side of the light receiving portion of the sensor unit.

11. The defect inspection apparatus according to claim 1, wherein the second wavelength plate is a ½ wavelength plate, and the second wavelength plate controls a polarization direction such that S-polarized light enters the sensor unit.

* * * * *